(12) United States Patent
Arayashiki et al.

(10) Patent No.: US 7,450,058 B2
(45) Date of Patent: Nov. 11, 2008

(54) RADAR OSCILLATOR CAPABLE OF PREVENTING LEAK OF OSCILLATION OUTPUT

(75) Inventors: Yutaka Arayashiki, Hadano (JP); Sumio Saito, Atsugi (JP); Masanori Ejima, Kuki (JP)

(73) Assignees: Anritsu Corporation, Atsugi-shi (JP); Matsushita Electric Industrial Co., Ltd., Kadoma-shi (JP)

( * ) Notice: Subject to any disclaimer, the term of this patent is extended or adjusted under 35 U.S.C. 154(b) by 202 days.

(21) Appl. No.: 10/562,988

(22) PCT Filed: May 23, 2005

(86) PCT No.: PCT/JP2005/009382

§ 371 (c)(1),
(2), (4) Date: Dec. 28, 2005

(87) PCT Pub. No.: WO2005/117256

PCT Pub. Date: Dec. 8, 2005

(65) Prior Publication Data

US 2007/0080854 A1    Apr. 12, 2007

(30) Foreign Application Priority Data

May 31, 2004    (JP) .............................. 2004-160977

(51) Int. Cl.
*G01S 13/02* (2006.01)
*G01S 7/03* (2006.01)

(52) U.S. Cl. ...................................... 342/175; 342/198

(58) Field of Classification Search .................. 342/198
See application file for complete search history.

(56) References Cited

U.S. PATENT DOCUMENTS

| 4,190,838 | A | * | 2/1980 | Kemp ........................... 342/20 |
| 5,140,333 | A | * | 8/1992 | Parker ......................... 342/371 |
| 5,311,190 | A | * | 5/1994 | Devendorf et al. .......... 342/157 |
| 5,334,969 | A | * | 8/1994 | Abe et al. ............... 340/426.26 |

(Continued)

FOREIGN PATENT DOCUMENTS

JP    40-11451    6/1940

(Continued)

OTHER PUBLICATIONS

FCC 02-48, New Part 15 Rules, "First Report and Order"; 2002; pp. 2, 74 & 108.

(Continued)

*Primary Examiner*—Thomas G. Black
*Assistant Examiner*—Shelley Chen
(74) *Attorney, Agent, or Firm*—Frishauf, Holtz, Goodman & Chick, P.C.

(57) ABSTRACT

The present invention, in order to enable intermittent output of an oscillation signal without essentially producing a leak in response to a pulse signal indicating a transmission timing of a radar wave, employs a configuration in which an operation of an oscillating unit (21) itself of a radar oscillator is alternately changed between an oscillating state and an oscillation stop state by a switch (30), not a configuration in which an output passage of an oscillation signal is switched to be opened and closed as in a conventional radar oscillator.

4 Claims, 20 Drawing Sheets

U.S. PATENT DOCUMENTS

| | | | |
|---|---|---|---|
| 5,940,025 A * | 8/1999 | Koehnke et al. | 342/159 |
| 6,538,402 B2 * | 3/2003 | Gokturk et al. | 318/128 |
| 2001/0008355 A1 * | 7/2001 | Gokturk et al. | 310/126 |
| 2007/0080854 A1 * | 4/2007 | Arayashiki et al. | 342/175 |

FOREIGN PATENT DOCUMENTS

| | | | |
|---|---|---|---|
| JP | 60-72306 A | 4/1985 | |
| JP | 5-16764 A | 1/1993 | |

OTHER PUBLICATIONS

Notification Concerning Transmittal of International Preliminary Report on Patentability and Written Opinion, Chapter I of the Patent Cooperation Treaty for PCT/JP2005/009382 dated Dec. 14, 2006, 10 sheets.

* cited by examiner

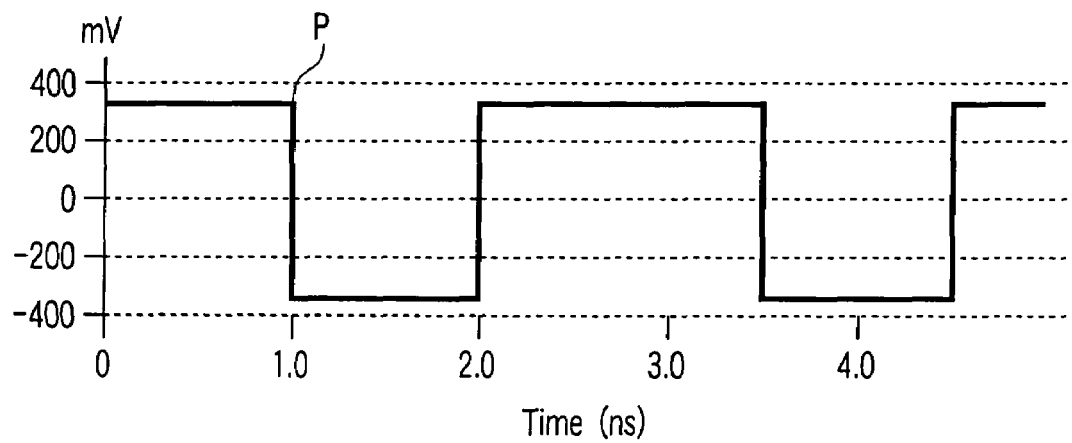
F I G. 3A
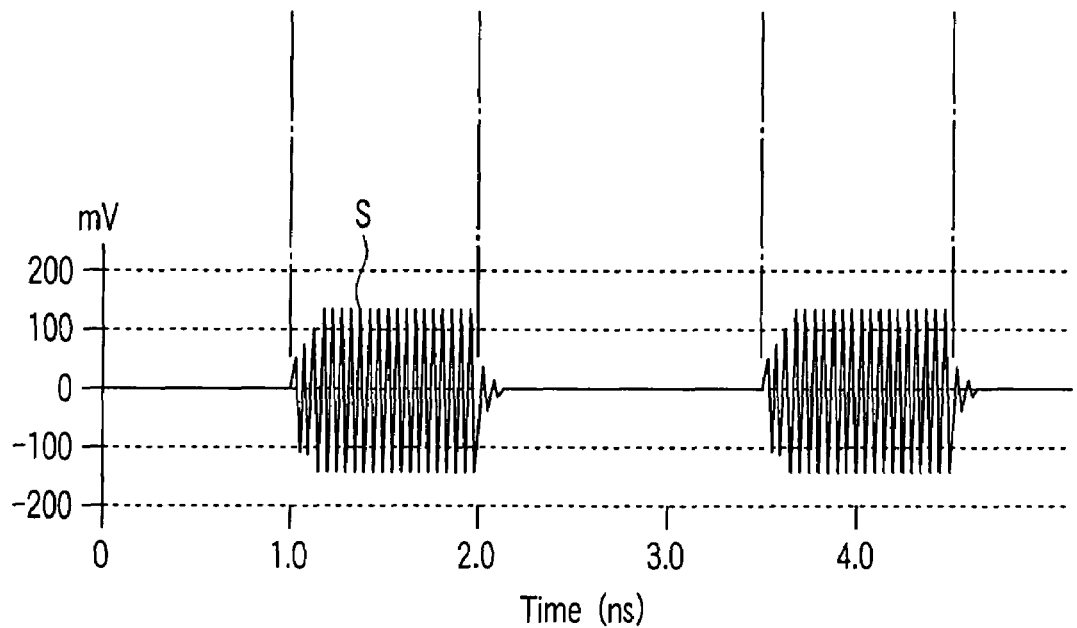
F I G. 3B

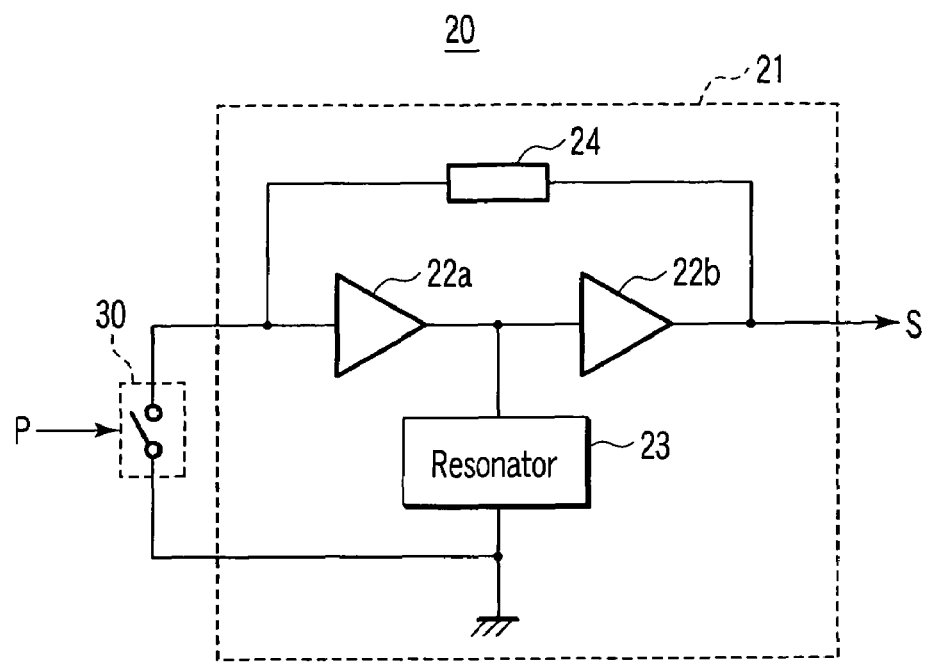
F I G. 15
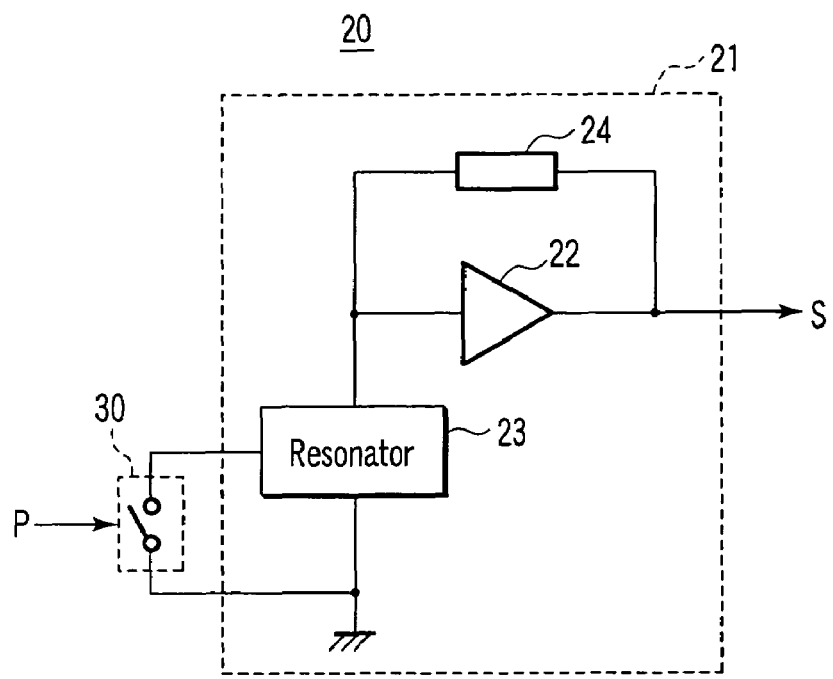
F I G. 16

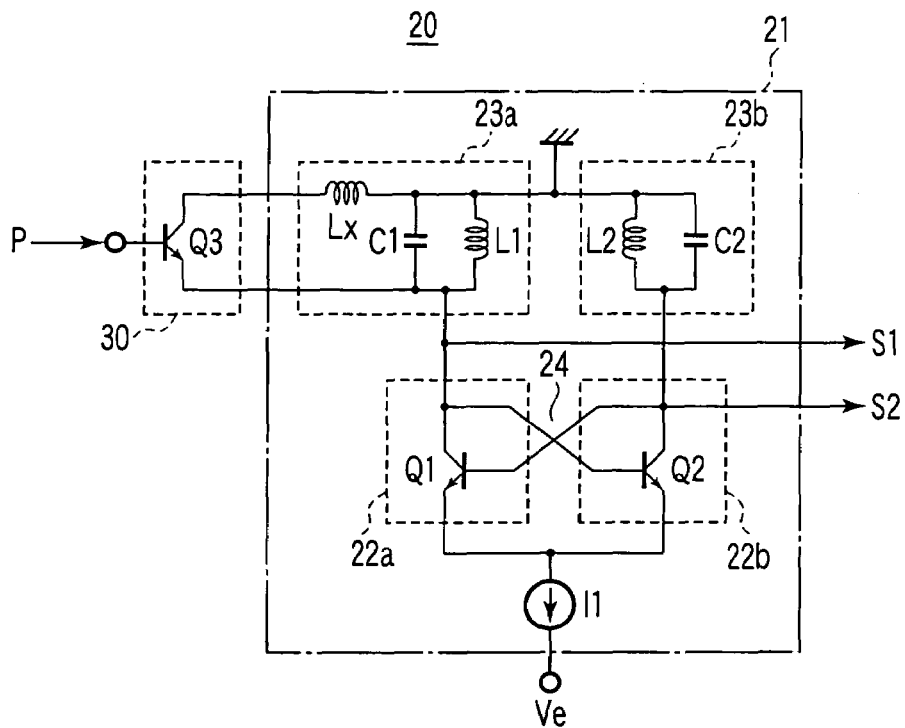
F I G. 31
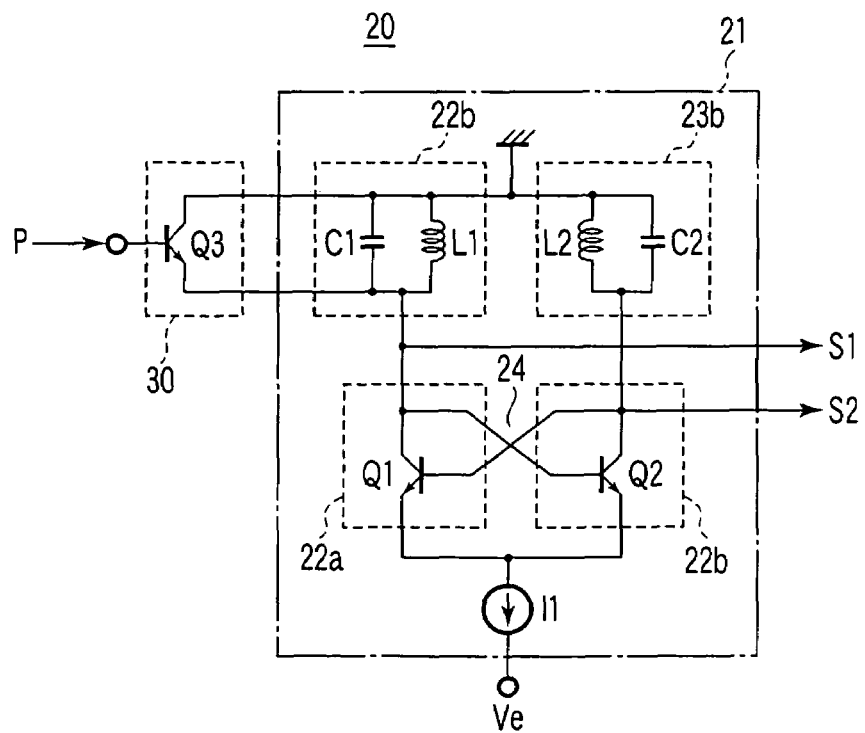
F I G. 32

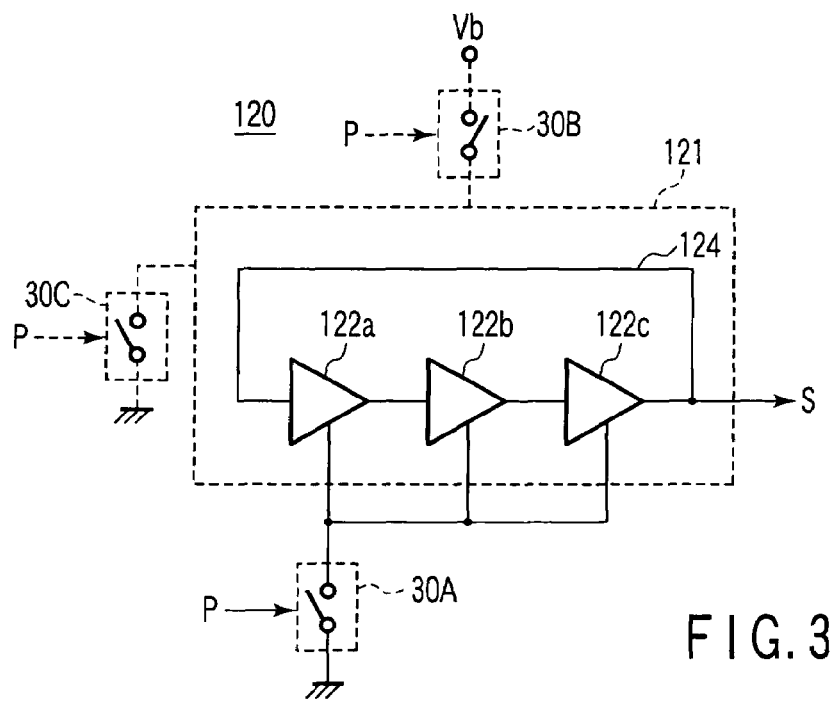
F I G. 37
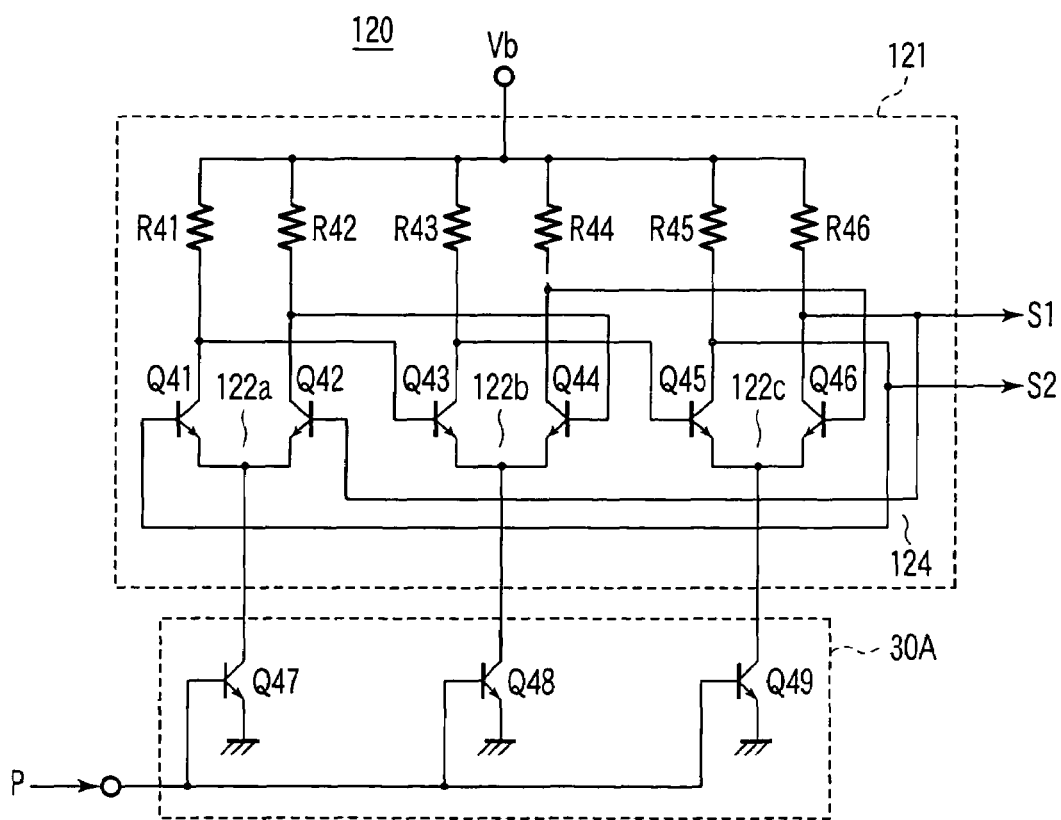
F I G. 38

RADAR OSCILLATOR CAPABLE OF PREVENTING LEAK OF OSCILLATION OUTPUT

This application is a U.S. National Phase Application under 35 USC 371 of International Application PCT/JP2005/009382 filed May 23, 2005.

TECHNICAL FIELD

The present invention relates to a radar oscillator, and more particularly, to a radar oscillator for use in a radar transmitter section, for example, a transmitter section of a small output such as an ultra wide band (UWB) radar as a short distance radar device for car mounting, a blind person, medical application and the like, the radar oscillator using a technique capable of preventing a leak of an oscillation output.

BACKGROUND ART

For example, in a radar oscillator for use in a transmitter section for transmitting an oscillation signal of low power such as a UWB radar as a short distance radar device for car mounting or for a blind person, a medical application and the like, an output of an oscillation signal having a quasi-millimeter wave (22 to 29 GHz) is intermittently continued by a pulse signal indicating a transmission timing of a radar wave from the outside section.

FIG. 11 is a block diagram depicting a circuit configuration of a conventional radar oscillator 10 of such a type.

That is, in the radar oscillator 10, an oscillating unit 11 has an amplifier 12, a resonator 13 connected to an output section of the amplifier 12, and a feedback circuit 14 which positively feeds back an output of the amplifier 12 to an input side, thereby oscillating a signal of a frequency which depends on the resonator 13.

An oscillation signal output from the oscillating unit 11 is input to a switch 15 (an electronic switch such as a semiconductor) which is periodically opened and closed by a pulse signal P indicating a transmission timing of a radar wave.

Then, when the pulse signal P is at a first level (for example, low level), the switch 15 is closed, and an oscillation signal S is output. When the pulse signal is at a second level (for example, high level), the switch 15 is opened, and the oscillation signal S is not output.

However, in the conventional radar oscillator 10 which periodically opens and closes an output passage of the oscillation signal by the switch 15 as described above, the oscillating unit 11 itself of the radar oscillator 10 is always in an operating state (oscillating state) regardless of the opening and closing of the switch 15 while the switch 15 is opened when the pulse signal P is at the second level (for example, high level). Thus, even while the switch 15 is opened, the oscillation signal from the oscillating unit 11 leaks through an equivalent high frequency stray capacitance component, a high frequency parasitic capacitance component or the like of the switch 15. Therefore, there is a problem that the oscillation signal output cannot be stopped completely.

In particular, as described previously, it is difficult to prevent a leak from the switch 15 at a high frequency bandwidth of 22 to 29 GHz.

FIGS. 12A and 12B are timing charts each showing an operation of the above-described conventionally configured radar oscillator.

That is, although an oscillation signal S as shown in FIG. 12B is output during a low level period of a pulse signal P shown in FIG. 12A, a leak component S' of the oscillation signal is output during a high level period of the pulse signal. Thus, an output ratio between the low level period and the high level period is not obtained as only about 20 dB.

The leak component S' restricts a substantial receiving sensitivity of a reflection wave with respect to a radar wave output at a regular transmission timing, thus narrowing a radar search range and making it difficult to detect an obstacle of a low reflection index.

In addition, with respect to the above-described UWB radar system, the Federal Communication Committee (FCC) restricts that the average power density in a bandwidth of 22 to 29 GHz be −41 dBM/MHz or less and the peak power density be 0 dBM/50 MHz or less in Non-Patent Document 1 below.

Non-patent document 1: FCC02-48, New Part 15 Rules, "FIRST REPORT AND ORDER"

Namely, in the above UWB radar system, the total amount of energy in the bandwidth of 22 to 29 GHz is restricted. Thus, if the leak component S' is large, the output level of a regular oscillation signal must be set low concurrently, and the search distance or the like is largely restricted.

DISCLOSURE OF INVENTION

The present invention has been made in order to solve the above-described problem of the prior art, and it is an object of the invention to provide a radar oscillator capable of intermittently outputting an oscillation signal without producing a leak in response to a pulse signal indicating a transmission timing of a radar wave.

In order to achieve the above object, the present invention is characterized by employing a configuration for alternatively switching an operation of an oscillating unit itself of a radar oscillator between an operating state and a non-operating state (an oscillating state and an oscillation stop state) by a switch instead of a configuration for opening and closing an output passage of an oscillation signal by a switch, unlike the conventional radar oscillator, in order to enable an intermitting output of an oscillation signal without producing a leak in response to a pulse signal indicating a transmission timing of a radar wave.

That is, according to the configuration of the radar oscillator employed in the present invention, an oscillating unit of a radar oscillator enters an oscillating state during a period of closing a switch when a pulse signal indicating a transmission timing of a radar wave is at a first level (for example, low level), and the oscillating unit itself of the radar oscillator enters an oscillation stop state during a period of opening the switch when the pulse signal is at a second level (for example, high level), thus making it possible to intermittently output an oscillation signal without essentially producing a leak in response to a pulse signal indicating a transmission timing of a radar wave.

Specifically, in order to achieve the above object, according to a first aspect of the present invention, there is provided a radar oscillator comprising:

an oscillating unit (21) having amplifier means (22), and in order to contribute to oscillation at a predetermined frequency together with the amplifier means, at least one of a feedback circuit (24) which applies a positive feedback from an output side to an input side of the amplifier means and a resonator (23) which resonates at the predetermined frequency, the resonator being connected to an input section or output section of the amplifier means, the oscillating unit outputting and stopping an oscillation signal having the predetermined frequency from the output side of the amplifier means in an oscillating state and an oscillation stop state; and switching means (30) connected to the oscillating unit, the switching means being composed of an electronic switch which, receives a pulse signal indicating a transmission timing of a radar wave, and alternately changes an operating state of the oscillating unit between the oscillating state and the oscillation stop state at first and second levels of the pulse signal in order to intermit an output of the oscillation signal in response to a level of the pulse signal.

In order to achieve the above object, according to a second aspect of the present invention, there is provided a radar oscillator according to the first aspect, wherein the oscillating unit has both of the feedback circuit (24) which applies a positive feedback from the output side to the input side of the amplifier means and the resonator (23) which resonates at the predetermined frequency, the resonator being connected to the input section or output section of the amplifier means, and outputs and stops the oscillation signal having the predetermined frequency determined by the resonator from the output side of the amplifier means in the oscillating state and the oscillation stop state.

In order to achieve the above object, according to a third aspect of the present invention, there is provided a radar oscillator according to the first aspect, wherein the oscillating unit has a plurality of amplifiers cascade-connected to each other as the amplifier means; also has both of the feedback circuit (24) which applies the positive feedback to the input side of an amplifier at a first stage from an output side of an amplifier at a final stage of the plurality of amplifiers and the resonator (23) which resonates at the predetermined frequency, the resonator being connected to a cascade-connecting section of the plurality of amplifiers; and outputs and stops the oscillation signal having the predetermined frequency determined by the resonator from the output side of the amplifier at the final stage of the plurality of amplifiers in the oscillating state and the oscillation stop state.

In order to achieve the above object, according to a fourth aspect of the present invention, there is provided a radar oscillator according to the first aspect, wherein the oscillating unit has a field effect transistor (FET) serving as the amplifier means and a distributed parameter line connected to the FET and having a length such that the FET generates a negative resistance contributing to oscillation at a predetermined frequency; also has only the resonator (23) which resonates at the predetermined frequency, the resonator being configured of a distributed parameter line connected to an input section of the FET and having a length of λ/4 of the predetermined frequency; and outputs and stops the oscillation signal having the predetermined frequency determined by the resonator from an output side of the FET in the oscillating state and the oscillation stop state.

In order to achieve the above object, according to a fifth aspect of the present invention, there is provided a radar oscillator according to the first aspect, wherein the oscillating unit has a plurality of amplifiers (122a, 122b, 122c) cascade-connected to each other as the amplifier means; is configured as a ring oscillator circuit having only the feedback circuit which applies a feedback to an input section of an amplifier at a first stage from an output section of an amplifier at a final stage of the plurality of amplifiers; and outputs and stops the oscillation signal having the predetermined frequency determined by the ring oscillator circuit from the output section of the amplifier at the final stage in the oscillating state and the oscillation stop state.

In order to achieve the above object, according to a sixth aspect of the present invention, there is provided a radar oscillator according to the first aspect, wherein the oscillating unit has a high frequency earth line, and the switching means includes a first switch which opens or closes between at least one of the input section and the output section of the amplifier means in the oscillating unit and the high frequency earth line of the oscillating unit based on the pulse signal indicating the transmission timing of the radar wave, thereby alternately changing the operating state of the oscillating unit between the oscillating state and the oscillation stop state.

In order to achieve the above object, according to a seventh aspect of the present invention, there is provided a radar oscillator according to the first aspect, wherein the oscillating unit has an element to set the oscillating unit outside of an oscillation enable range, and the switching means includes a second switch which connects or disconnects the element to set the oscillating unit outside of the oscillation enable range to and from the oscillator based on the pulse signal indicating the transmission timing of the radar wave, thereby alternately changing the operating state of the oscillating unit between the oscillating state and the oscillation stop state.

In order to achieve the above object, according to an eighth aspect of the present invention, there is provided a radar oscillator according to the first aspect, wherein the oscillating unit has a power supply line for the amplifier means in the oscillating unit, and the switching means includes a third switch which opens or closes the power supply line for the amplifier means in the oscillating unit based on the pulse signal indicating the transmission timing of the radar wave, thereby alternately changing the operating state of the oscillating unit between the oscillating state and the oscillation stop state.

In order to achieve the above object, according to a ninth aspect of the present invention, there is provided a radar oscillator according to the first aspect, wherein the oscillating unit selectively has a high frequency earth line, a power supply line for the amplifier means in the oscillating unit, and an element to set the oscillating unit outside of an oscillation enable range, and the switching means includes a plurality of switches obtained by selectively combining:

a first switch which opens or closes between at least one of the input section and the output section of the amplifier means in the oscillating unit and the high frequency earth line based on the pulse signal indicating the transmission timing of the radar wave, thereby alternately changing the operating state of the oscillating unit between the oscillating state and the oscillation stop state;

a second switch which connects or disconnects the element to set the oscillating unit outside of the oscillation enable range to and from the oscillating unit based on the pulse signal indicating the transmission timing of the radar wave, thereby alternately changing the operating state of the oscillating unit between the oscillating state and the oscillation stop state; and a third switch which opens or closes the power supply line for the amplifier means in the oscillating unit based on the pulse signal indicating the transmission timing of the radar wave, thereby alternately changing the operating state of the oscillating unit between the oscillating state and the oscillation stop state.

In order to achieve the above object, according to a tenth aspect of the present invention, there is provided a radar oscillator according to the second aspect, wherein the oscillating unit has a high frequency earth line, and the switching means includes a first switch which opens or closes between at least one of the input section and the output section of the amplifier means in the oscillating unit and the high frequency earth line of the oscillating unit based on the pulse signal indicating the transmission timing of the radar wave, thereby alternately changing the operating state of the oscillating unit between the oscillating state and the oscillation stop state.

In order to achieve the above object, according to an eleventh aspect of the present invention, there is provided a radar oscillator according to the second aspect, wherein the oscillating unit has an element to set a resonance frequency of the oscillator in the oscillating unit outside of an oscillation enable range in the oscillating unit, and the switching means includes a second switch which connects or disconnects the element to set the resonance frequency of the resonator in the oscillating unit outside of the oscillation enable range to and from the oscillating unit based on the pulse signal indicating the transmission timing of the radar wave, thereby alternately changing the operating state of the oscillating unit between the oscillating state and the oscillation stop state.

In order to achieve the above object, according to a twelfth aspect of the present invention, there is provided a radar oscillator according to the second aspect, wherein the oscillating unit has a power supply line for the amplifier means in the oscillating unit, and the switching means includes a third switch which opens or closes the power supply line for the amplifier means in the oscillating unit based on the pulse signal indicating the transmission timing of the radar wave, thereby alternately changing the operating state of the oscillating unit between the oscillating state and the oscillation stop state.

In order to achieve the above object, according to a thirteenth aspect of the present invention, there is provided a radar oscillator according to the second aspect, wherein the oscillating unit selectively has a high frequency earth line, a power supply line for the amplifier means in the oscillating unit, and an element to set a resonance frequency of the resonator in the oscillating unit outside of an oscillation enable range in the oscillating unit, and the switching means includes a plurality of switches obtained by selectively combining:

a first switch which opens or closes between at least one of the input section and the output section of the amplifier means in the oscillating unit and the high frequency earth line based on the pulse signal indicating the transmission timing of the radar wave, thereby alternately changing the operating state of the oscillating unit between the oscillating state and the oscillation stop state;

a second switch which connects or disconnects the element to set the resonance frequency of the resonator in the oscillating unit outside of the oscillation enable range to and from the resonator based on the pulse signal indicating the transmission timing of the radar wave, thereby alternately changing the operating state of the oscillating unit between the oscillating state and the oscillation stop state; and a third switch which opens or closes the power supply line for the amplifier means in the oscillating unit based on the pulse signal indicating the transmission timing of the radar wave, thereby alternately changing the operating state of the oscillating unit between the oscillating state and the oscillation stop state.

In order to achieve the above object, according to a fourteenth aspect of the present invention, there is provided a radar oscillator according to the third aspect, wherein the oscillating unit has a high frequency earth line, and the switching means includes a first switch which opens or closes between at least one of the input section of the amplifier at a first stage of the plurality of amplifiers and the output section of the amplifier at a final stage of the plurality of amplifiers and the high frequency earth line of the oscillating unit based on the pulse signal indicating the transmission timing of the radar wave, thereby alternately changing the operating state of the oscillating unit between the oscillating state and the oscillation stop state.

In order to achieve the above object, according to a fifteenth aspect of the present invention, there is provided a radar oscillator according to the third aspect, wherein the oscillating unit has an element to set the oscillating unit outside of an oscillation enable range, and the switching means includes a second switch which connects or disconnects the element to set the oscillating unit outside of the oscillation enable range to and from the oscillating unit based on the pulse signal indicating the transmission timing of the radar wave, thereby alternately changing the operating state of the oscillating unit between the oscillating state and the oscillation stop state.

In order to achieve the above object, according to a sixteenth aspect of the present invention, there is provided a radar oscillator according to the third aspect, wherein the oscillating unit has a power supply line for the plurality of amplifiers serving as the amplifier means in the oscillating unit, and the switching means includes a third switch which opens or closes the power supply line for at least one amplifier of the plurality of amplifiers in the oscillating unit based on the pulse signal indicating the transmission timing of the radar wave, thereby alternately changing the operating state of the oscillating unit between the oscillating state and the oscillation stop state.

In order to achieve the above object, according to a seventeenth aspect of the present invention, there is provided a radar oscillator according to the third aspect, wherein the oscillating unit selectively has a high frequency earth line, a power supply line for the plurality of amplifiers serving as the amplifier means in the oscillating unit, and an element to set the oscillating unit outside of an oscillation enable range, and the switching means includes a plurality of switches obtained by selectively combining:

a first switch which opens or closes between at least one of the input section of the amplifier at a first stage of the plurality of amplifiers serving as the amplifier means in the oscillating unit and the output section of the amplifier at a final stage of the plurality of amplifiers and the high frequency earth line of the oscillating unit based on the pulse signal indicating the transmission timing of the radar wave, thereby alternately changing the operating state of the oscillating unit between the oscillating state and the oscillation stop state;

a second switch which connects or disconnects the element to set the oscillating unit outside of the oscillation enable range to and from the oscillating unit based on the pulse signal indicating the transmission timing of the radar wave, thereby alternately changing the operating state of the oscillating unit between the oscillating state and the oscillation stop state; and a third switch which opens or closes the power supply line for at least one amplifier of the plurality of amplifiers in the oscillating unit based on the pulse signal indicating the transmission timing of the radar wave, thereby alternately changing the operating state of the oscillating unit between the oscillating state and the oscillation stop state.

In order to achieve the above object, according to an eighteenth aspect of the present invention, there is provided a radar oscillator according to the fourth aspect, wherein the oscillating unit has a high frequency earth line, and the switching means includes a first switch which opens or closes between at least one of the input section and the output section of the FET serving as the amplifier means in the oscillating unit and the high frequency earth line of the oscillating unit based on the pulse signal indicating the transmission timing of the radar wave, thereby alternately changing the operating state of the oscillating unit between the oscillating state and the oscillation stop state.

In order to achieve the above object, according to a nineteenth aspect of the present invention, there is provided a radar oscillator according to the fourth aspect, wherein the oscillating unit has an element to set a resonance frequency of the resonator in the oscillating unit outside of an oscillation enable range in the oscillating unit, and the switching means includes a second switch which connects or disconnects the element to set the resonance frequency of the resonator in the oscillating unit outside of the oscillation enable range in the oscillating unit to and from the oscillating unit based on the pulse signal indicating the transmission timing of the radar wave, thereby alternately changing the operating state of the oscillating unit between the oscillating state and the oscillation stop state.

In order to achieve the above object, according to a twentieth aspect of the present invention, there is provided a radar oscillator according to the fourth aspect, wherein the oscillating unit has a power supply line for the FET serving as the amplifier means in the oscillating unit, and the switching means includes a third switch which opens or closes the power supply line for the FET in the oscillating unit based on the pulse signal indicating the transmission timing of the radar wave, thereby alternately changing the operating state of the oscillating unit between the oscillating state and the oscillation stop state.

In order to achieve the above object, according to a twenty-first aspect of the present invention, there is provided a radar oscillator according to the fourth aspect, wherein the oscillating unit selectively has a high frequency earth line, a power supply line for the FET serving as the amplifier means in the oscillating unit, and an element to set a resonance frequency of the resonator in the oscillating unit outside of an oscillation enable range in the oscillating unit, and the switching means includes a plurality of switches obtained by selectively combining:

a first switch which opens or closes between at least one of the input section and the output section of the FET serving as the amplifier means in the oscillating unit and the high frequency earth line of the oscillating unit based on the pulse signal indicating the transmission timing of the radar wave, thereby alternately changing the operating state of the oscillating unit between the oscillating state and the oscillation stop state;

a second switch which connects or disconnects the element to set the resonance frequency of the resonator in the oscillating unit outside of the oscillation enable range in the oscillating unit to and from the oscillating unit based on the pulse signal indicating the transmission timing of the radar wave, thereby alternately changing the operating state of the oscillating unit between the oscillating state and the oscillation stop state; and a third switch which opens or closes the power supply line for the FET in the oscillating unit based on the pulse signal indicating the transmission timing of the radar wave, thereby alternately changing the operating state of the oscillating unit between the oscillating state and the oscillation stop state.

In order to achieve the above object, according to a twenty-second aspect of the present invention, there is provided a radar oscillator according to the fifth aspect, wherein the oscillating unit has a high frequency earth line, and the switching means includes a first switch which opens or closes between at least one of the input section of the amplifier at a first stage of the plurality of amplifiers serving as the amplifier means in the oscillating unit and the output section of the amplifier at a final stage of the plurality of amplifiers based on the pulse signal indicating the transmission timing of the radar wave, thereby alternately changing the operating state of the oscillating unit between the oscillating state and the oscillation stop state.

In order to achieve the above object, according to a twenty-third aspect of the present invention, there is provided a radar oscillator according to the fifth aspect, wherein the oscillating unit has an element to set the oscillating unit outside of an oscillation enable range, and the switching means includes a second switch which connects or disconnects the element to set the oscillating unit outside of the oscillation enable range to and from the oscillating unit based on the pulse signal indicating the transmission timing of the radar wave, thereby alternately changing the operating state of the oscillating unit between the oscillating state and the oscillation stop state.

In order to achieve the above object, according to a twenty-fourth aspect of the present invention, there is provided a radar oscillator according to the fifth aspect, wherein the oscillating unit has a power supply line for the plurality of amplifiers serving as the amplifier means in the oscillating unit, and the switching means include a third switch which opens or closes the power supply line for at least one amplifier in the plurality of amplifiers in the oscillating unit based on the pulse signal indicating the transmission timing of the radar wave, thereby alternately changing the operating state of the oscillating unit between the oscillating state and the oscillation stop state.

In order to achieve the above object, according to a twenty-fifth aspect of the present invention, there is provided a radar oscillator according to the fifth aspect, wherein the oscillating unit selectively has a high frequency earth line, a power supply line for the plurality of amplifiers serving as the amplifier means in the oscillating unit, and an element to set the oscillating unit outside of an oscillation enable range, and the switching means includes a plurality of switches obtained by selectively combining:

a first switch which opens or closes between at least one of the input section of the amplifier at a first stage of the plurality of amplifiers serving as the amplifier means in the oscillating unit and the output section of the amplifier at a final stage of the plurality of amplifiers and the high frequency earth line of the oscillating unit based on the pulse signal indicating the transmission timing of the radar wave, thereby alternately changing the operating state of the oscillating unit between the oscillating state and the oscillation stop state;

a second switch which connects or disconnects the element to set the oscillating unit outside of the oscillation enable range to and from the oscillating unit based on the pulse signal indicating the transmission timing of the radar wave, thereby alternately changing the operating state of the oscillator between the oscillating state and the oscillation stop state; and a third switch which opens or closes the power supply line for at least one amplifier in the plurality of amplifiers in the oscillating unit based on the pulse signal indicating the transmission timing of the radar wave, thereby alternately changing the operating state of the oscillating unit between the oscillating state and the oscillation stop state.

As described above, in the radar oscillator according to the present invention, an operating state itself of the oscillating unit is alternately switched between the oscillating state and the oscillation stop state in response to the level of the pulse signal by the switch. Thus, although the oscillation signal is output in the oscillating state, the intermittent output of the oscillation signal in response to the level of the pulse signal becomes possible without producing a leak in the oscillation stop state.

In addition, in the radar oscillator according to the present invention, at least one of the input section and the output section of the amplifier and the high frequency earth line are opened or closed by the switch, whereby, when the switch is opened, the positive feedback is applied to the amplifier, and the oscillating state is established. When the switch is closed, the positive feedback is not applied to the amplifier, and the oscillation stop state in which the oscillating operation stops is established.

In this case, the amplifier is constantly in an operating state, and thus, the oscillation signal is output in the oscillating state while high speed responsiveness is established with respect to the changeover of the switch. However, in the oscillation stop state, the intermittent output of the oscillation signal in response to the level of the pulse signal becomes possible without producing the leak.

Further, in the radar oscillator according to the present invention, the element to set a resonance frequency of the resonator outside of an oscillation enable range is connected or disconnected by the switch, whereby, when the element is disconnected from the resonator, the resonance frequency of the resonator is within a desired oscillating operation range. Then, the oscillation signal having the resonance frequency is positively fed back, and enters the oscillating state. When the element is connected to the resonator by the switch, the resonance frequency is outside of the oscillating operation range, and no positive feedback is applied. Then, the oscillation stop state in which the oscillating operation stops is established.

In this case also, the amplifier is constantly in an operating state, and thus, the oscillation signal is output in the oscillating state while high speed responsiveness is maintained with respect to the changeover of the switch. However, in the oscillation stop state, an intermittent output of the oscillation signal in response to the level of the pulse signal becomes possible without producing a leak in the oscillation stop state.

Furthermore, in the radar oscillator according to the present invention, a power supply line of an amplifier is opened or closed by a switch, whereby, when the switch is closed and power is supplied to the amplifier, an oscillating state is established. When the switch is opened and power supply is stopped, an oscillation stop state in which an oscillating operation stops is established.

In this case, although an oscillation signal is output in the oscillating state, an operation of the amplifier itself stops due to stoppage of power supply in the oscillation stop state. Thus, an intermittent output of the oscillation signal in response to the level of the pulse signal becomes possible without producing a leak.

In the present invention, a power supply for stopping power supply by the switch includes a bias power supply (C power supply) as well as a main power supply (B power supply) of the amplifier.

In addition, in the radar oscillator according to the present invention, although an oscillation signal is output in the oscillating state as described previously by selectively combining the above-described switches, it becomes possible to reliably prevent an occurrence of a leak and to intermittently output the oscillation signal in response to the level of the pulse signal in the oscillation stop state.

BRIEF DESCRIPTION OF DRAWINGS

FIG. 3A is a timing chart of a pulse signal provided to explain an operation of the radar oscillator according to the first embodiment shown in FIG. 1.

FIG. 3B is an output timing chart of an oscillation signal provided to explain an operation of the radar oscillator according to the first embodiment shown in FIG. 1.

FIG. 15 is a block diagram depicting a schematic configuration of a modified example of the radar oscillator according to the first embodiment shown in FIG. 1.

FIG. 16 is a block diagram depicting a schematic configuration of a modified example of the radar oscillator according to the third embodiment shown in FIG. 6.

FIG. 31 is a block diagram depicting a specific circuit configuration of a modified example of the radar oscillator according to the third embodiment shown in FIG. 6.

FIG. 32 is a block diagram depicting a specific circuit configuration of a modified example of the radar oscillator according to the second embodiment shown in FIG. 4.

FIG. 37 is a block diagram showing a schematic configuration of the radar oscillator according to the sixth embodiment shown in FIG. 35.

FIG. 38 is a diagram showing a specific circuit configuration of the radar oscillator according to the sixth embodiment shown in FIG. 35.

BEST MODE FOR CARRYING OUT THE PRESENT INVENTION

First, a basic configuration of a radar oscillator according to the present invention will be described here. As shown in FIGS. 1, 28, 29 and 35 described later, the radar oscillator composed of: an oscillating unit 21 having an amplifier (means) 22, and in order to contribute to oscillation at a predetermined frequency together with the amplifier (means) 22, at least one of a feedback circuit 24 which applies a positive feedback from an output side to an input side of the amplifier (means) 22 and a resonator 23 which resonates at the predetermined frequency, the resonator being connected to an input section or output section of the amplifier (means) 22, the oscillating unit outputting and stopping an oscillation signal having the predetermined frequency from the output side of the amplifier (means) 22 in an oscillating state and an oscillation stop state; and a switch (means) 30 connected to the oscillating unit 21, the switch (means) being composed of an electronic switch which, receives a pulse signal indicating a transmission timing of a radar wave, and alternately changes an operating state of the oscillating unit between the oscillating state and the oscillation stop state at first and second levels of the pulse signal in order to intermit the output of the oscillation signal in response to a level of the pulse signal.

Hereinafter, some embodiments of the radar oscillator according to the present invention will be described with reference to the accompanying drawings.

First Embodiment

Figure 1:
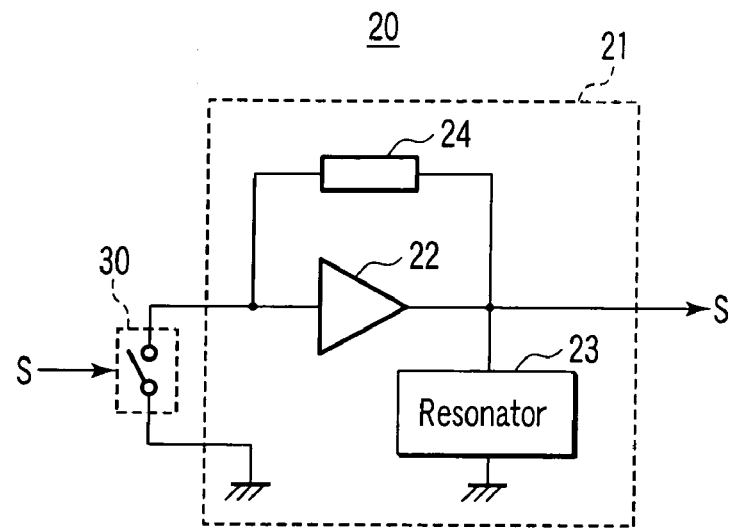
FIG. 1 is a block diagram depicting a schematic configuration of a radar oscillator according to a first embodiment of the present invention.

FIG. 1 is a block diagram depicting a schematic configuration of a radar oscillator 20 according to a first embodiment of the present invention.

The radar oscillator 20 is composed of an oscillating unit 21 and a switch 30 connected to the oscillating unit 21.

Figure 13:
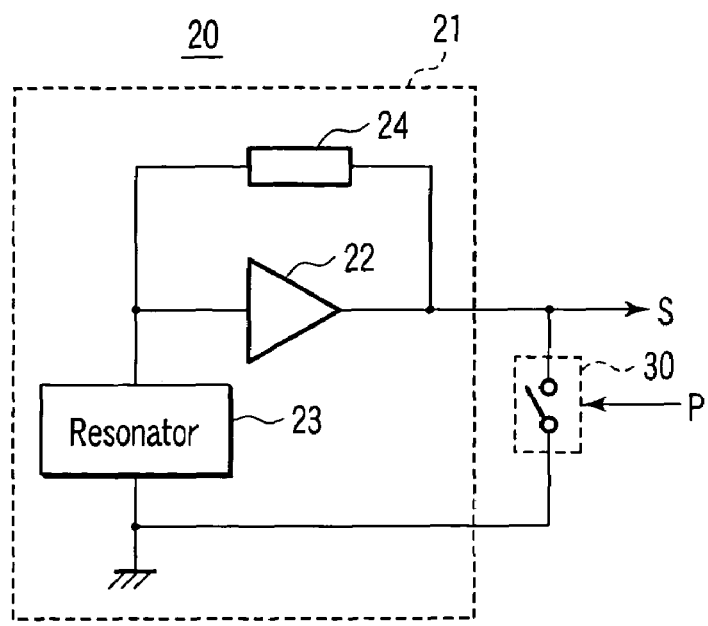
FIG. 13 is a block diagram depicting a schematic configuration of a modified example of the radar oscillator according to the first embodiment shown in FIG. 1.

The oscillating unit 21 is composed of: an amplifier 22; a resonator 23 connected to an output section of the amplifier 22 (may be an input section of the amplifier 22, as shown in FIG. 13 described later), the resonator contributing to oscillation at a predetermined frequency together with the amplifier 22 and having a resonance frequency which determines an oscillation frequency as the oscillator 21; and a feedback circuit 24 which applies a positive feedback from an output side of the amplifier 22 to an input side and outputs an oscillation signal S having a predetermined frequency determined by the resonator 23.

Here, the amplifier 22 may be either of an inversion type and an in-phase type, and may be configured according to such an amplifier type.

For example, in the case where the amplifier 22 is of inversion type, the feedback circuit 24 is used as that of inversion type, whereby a positive feedback can be applied to the amplifier 22.

In addition, in the case where the amplifier 22 is of in-phase type, the feedback circuit 24 is used as that of in-phase type (simply, a capacitor or the like may be used), whereby a positive feedback can be applied to the amplifier 22.

On the other hand, the switch 30, as described later, is composed of an electronic switch such as a bipolar transistor, a field effect transistor, or a diode. A pulse signal P indicating a transmission timing of a radar wave is received at a control signal input terminal of the switch, and an operating state of the oscillating unit 21 is alternately switched between an oscillating state and an oscillation stop state according to first and second levels of the pulse signal P.

In this embodiment, the switch 30 is connected so as to enable opening or closing between an input section of the amplifier section 22 (which may be an output section of the amplifier 22 as shown in FIG. 13 described later) and an earth line (which is a high frequency earth line and may be either of positive and negative power supply lines).

The switch 30 opens when the pulse signal P is at a first level (for example, low level), sets the oscillating unit 21 to the oscillating state, and outputs the oscillation signal S. The switch 30 closes when the pulse signal P is at a second level (for example, high level), and connects the input section of the amplifier 22 to the earth line.

The input section of the amplifier 22 is connected to the earth line, whereby a positive feedback is not applied from the output side to the input side of the amplifier 22, and the oscillating unit 21 enters the oscillation stop state.

In practice, although a slight positive feedback is applied by an on resistance of the switch 30 itself, this does not reach a feedback quantity required to continue oscillation at the oscillating unit 21.

Such an oscillating unit 21 can be regarded as being configured to have both of the resonator 23 which resonates at a predetermined frequency and the feedback circuit 24 which applies a positive feedback from the output side to the input side of the amplifier (means) 22 in order to contribute to oscillation at a predetermined frequency together with the amplifier (means) 22.

Then, the switch (means) 30 connected to the oscillating unit 21 receives a pulse signal P indicating a transmission timing of a radar wave, and alternately switches an operating state of the oscillating unit 21 between the oscillating state and the oscillation stop state at the first and second levels of the pulse signal P in order to intermittently continue an output of the oscillation signal in response to a level of the pulse signal P, thereby making it possible for the radar oscillator 20 of FIG. 1 to intermittently output the oscillation signal S without essentially producing a leak.

Figure 2:
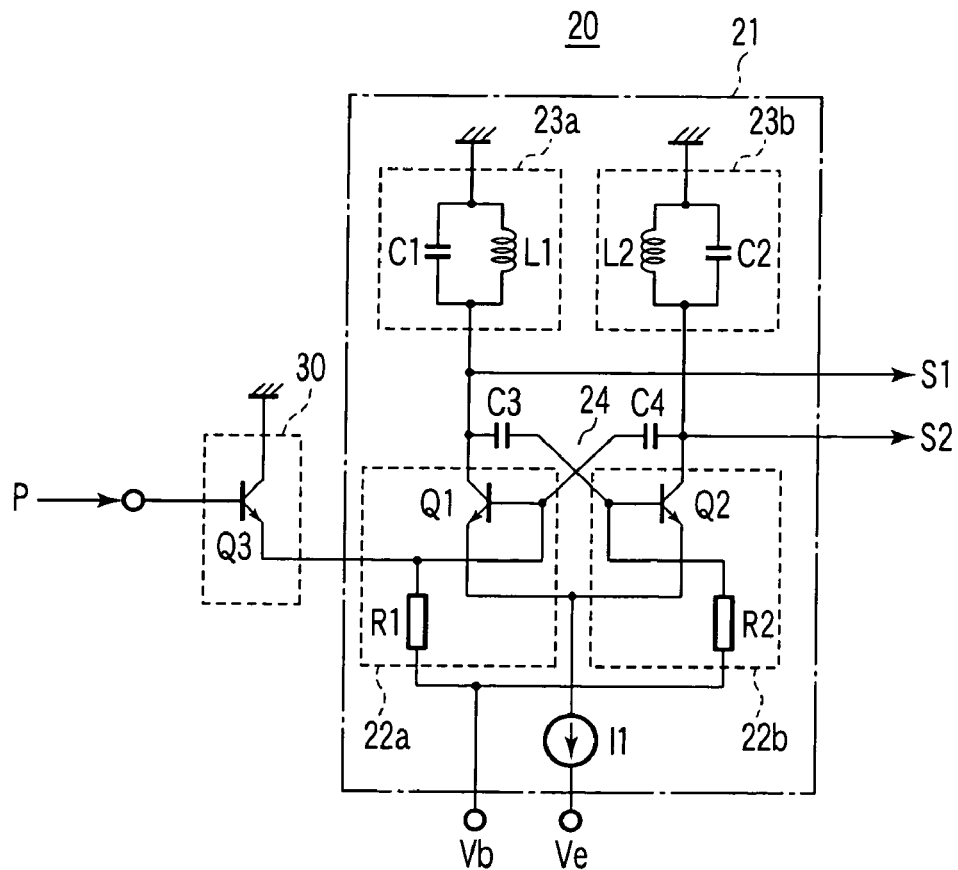
FIG. 2 is a diagram illustrating a specific circuit configuration of the radar oscillator according to the first embodiment shown in FIG. 1.

FIG. 2 is a diagram showing a specific circuit configuration of the radar oscillator 20 according to the first embodiment shown in FIG. 1.

The oscillating unit 21 of the radar oscillator 20 shown in FIG. 2 has: a resonator 23a formed to be connected in parallel with a coil L1 and a capacitor C1; an amplifier 22a composed of a transistor Q1 using the resonator 23a as a load and a base resistor R1; and an amplifier 22b composed of a transistor Q2 using the resonator 23b as a load and a base resistor R2.

A collector (output of the amplifier 22a) of the transistor Q1 and a base (input of the amplifier 22b) of the transistor Q2 are connected to each other via a capacitor C3 which configures a part of the feedback circuit 24, as described later.

In addition, a collector (output of the amplifier 22b) of the transistor Q2 and a base (input of the amplifier 22a) of the transistor Q1 are connected to each other via a capacitor C4 which configures a part of the feedback circuit 24, as described later.

Emitters of both of the transistors Q1 and Q2 are connected to a negative power supply Ve via a constant power source I1.

In addition, the base resistors R1 and R2 are connected to a bias power source Vb.

This oscillating unit continues an oscillating operation by the transistors Q1 and Q2 turning on/off alternately. If one amplifier 22a is defied as a main body of the amplifier, the other amplifier 22b configures the feedback circuit 24 which applies a positive feedback from an output side of the amplifier 22a to an input side of the amplifier 22a by inverting and amplifying the output by means of the amplifier 22b.

If the amplifiers 22a and 22b are regarded as one in-phase amplifier while these amplifiers are defined at a front stage and at a rear stage, respectively, the capacitor C4 which returns a signal from the amplifier 22b at the rear stage to the amplifier 22a at the front stage configures the feedback circuit 24.

The oscillating unit 21 according to the configuration of FIG. 2 can output two-phase oscillation signals S1 and S2 whose phases are inverted each other.

On the other hand, the switch 30 is composed of a transistor Q3.

Here, a collector of the transistor Q3 is connected to the earth line, and an emitter of the transistor Q3 is connected to the base of the transistor Q1 (which may be the other transistor Q2) of the amplifier 22a.

In this manner, when the pulse signal P received at the base is at a low level, the transistor Q3 causes an state between the collector and the emitter to enter an open state, maintains a positive feedback loop of the oscillating unit 21, and causes the oscillating unit 21 to enter an oscillating state.

When the pulse signal P received at the base is at a high level, the transistor Q3 causes a state between the collector and the emitter to enter a close state and causes the oscillating unit 21 to enter an oscillation stop state so as not to apply a positive feedback to the oscillating unit 21.

Such an oscillating unit 21 of FIG. 2, like the configuration of FIG. 1, has at least an amplifier (means) 22 which contributes to oscillation at a predetermined frequency. In addition, the oscillating unit can be regarded as being composed of the resonator 23 and the feedback circuit 24 which promote and stabilize oscillation at the predetermined frequency.

Like the configuration of FIG. 1, the switch (means) 30 connected to the oscillating unit 21, having received the pulse signal P indicating a transmission timing of a radar wave, alternately switches the operating state of the oscillating unit 21 between the oscillating state and the oscillation stop state at first and second levels of the pulse signal P in order to intermittently continue the output of the oscillation signal in response to the level of the pulse signal P, thereby making it possible for the radar oscillator 20 of FIG. 2 to intermittently output the oscillation signal S without producing a leak in response to the pulse signal indicating a transmission timing of a radar wave.

FIGS. 3A and 3B are timing charts each explaining an operation of the radar oscillator shown in FIG. 1 and FIG. 2.

That is, when the pulse signal P is at a low level as shown in FIG. 3A, an oscillation signal S having about 300 mV (p-p) is output from the oscillating unit 21 of the radar oscillator 20 as shown in FIG. 3B.

In addition, when the pulse signal P is at a high level as shown in FIG. 3A, the oscillating operation of the oscillating unit 21 stops as shown in FIG. 3B, so that no leak component is produced from the radar oscillator 20.

FIG. 13 is a block diagram depicting a schematic configuration of a modified example of the radar oscillator 20 according to the first embodiment of the present invention shown in FIG. 1.

The radar oscillator 20 shown in FIG. 13 is configured in the same way as in the radar oscillator 20 shown in FIG. 1 expect that, as described previously, the resonator 23 is connected to the input section of the amplifier 22; the switch 30 is connected so as to enable opening and closing between the output section of the amplifier 22 and the earth line (which is a high frequency earth line and may be either of positive and negative power supply lines).

Figure 14:
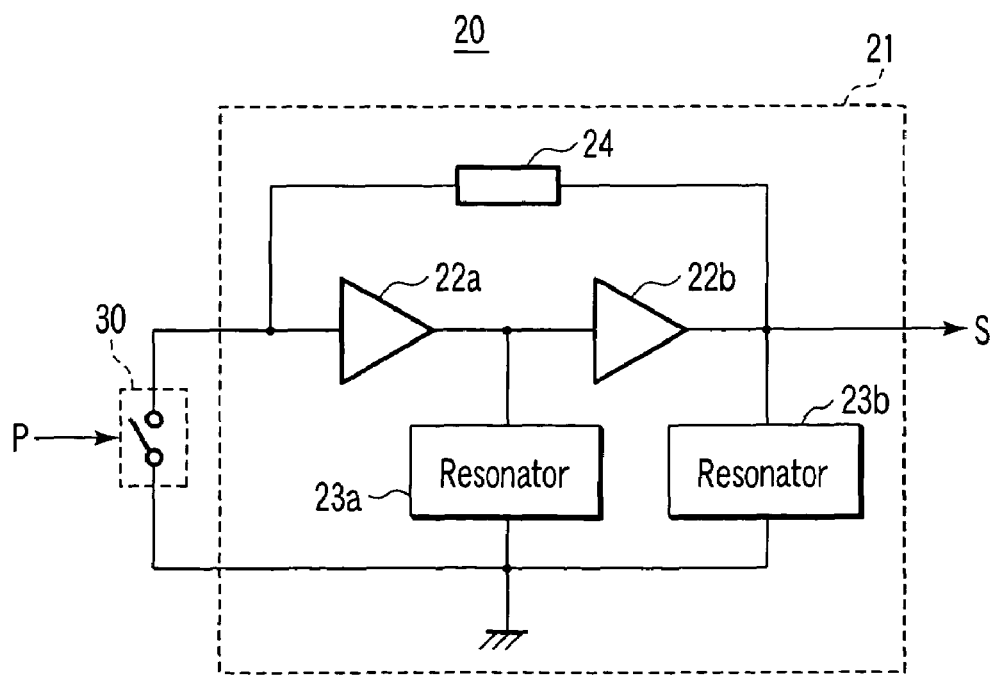
FIG. 14 is a block diagram depicting a schematic configuration of a modified example of the radar oscillator according to the first embodiment shown in FIG. 1.

FIGS. 14 and 15 are block diagrams each showing a schematic configuration of a modified example of the radar oscillator 20 according to the first embodiment of the present invention shown in FIG. 1.

The radar oscillator 20 shown in FIGS. 14 and 15 is configured in the same way as in the radar oscillator 20 shown in FIG. 1 except that a plurality of amplifiers 22a and 22b are cascade-connected to each other as the amplifier (means) 22 of the oscillating unit 21, and the radar oscillator further has: a feedback circuit 24 which applies a positive feedback to an input side of the amplifier 22a at a first stage from an output side of the amplifier 22b at a final stage of the plurality of amplifiers 22a and 22b; a resonator 23a connected to a cascade-connecting section of the plurality of amplifiers 22a and 22b, the resonator resonating at a predetermined frequency; and a resonator 23b connected to an output side of the amplifier 22b at the final stage of the plurality of amplifiers 22a and 22b, the radar oscillator being configured to output an oscillation signal having a predetermined frequency determined by the resonators 23a and 23b from the output side of the amplifier 22b at the final stage of the plurality of amplifiers.

The radar oscillator 20 shown in FIG. 15 comprises only one resonator 23 connected to the cascade-connecting section of the plurality of amplifiers 22a and 22b, the resonator resonating at a predetermined frequency.

Figure 28:
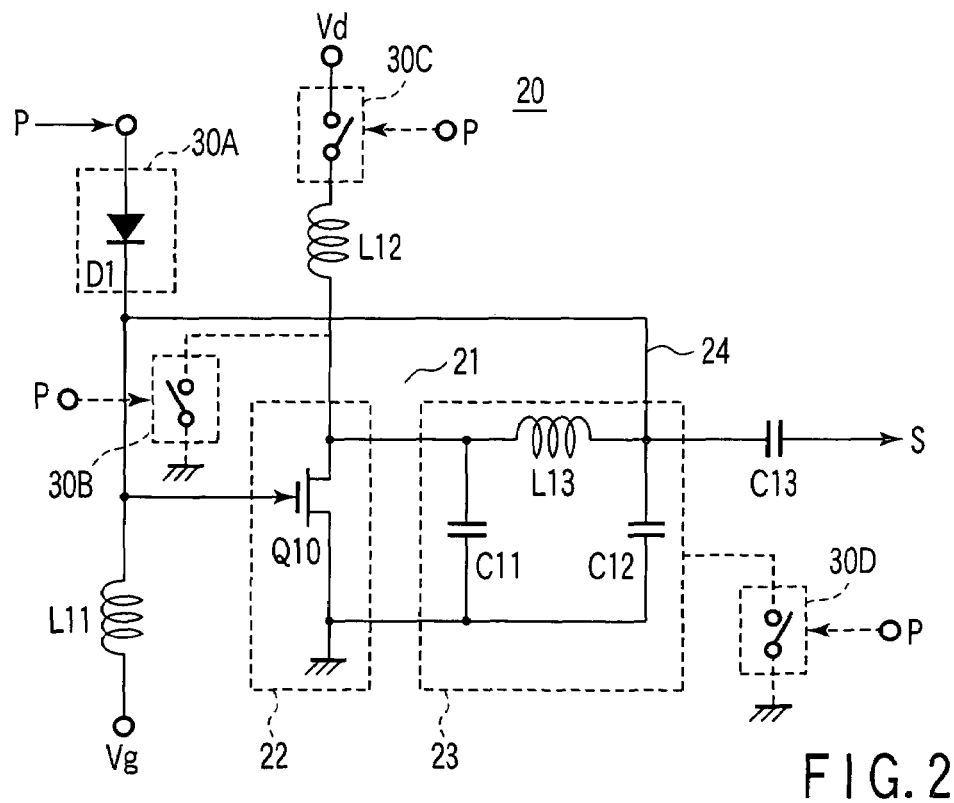
FIG. 28 is a block diagram depicting a specific circuit configuration of a modified example of the radar oscillator according to the first embodiment shown in FIG. 1.

FIG. 28 is a diagram showing a specific circuit configuration of a modified example of the radar oscillator 20 according to the first embodiment of the present invention shown in FIG. 1.

The radar oscillator 20 shown in FIG. 28 is configured in the same way as in the radar oscillator 20 shown in FIG. 1 expect that a switch 30A composed of a diode D1 is connected so as to enable opening and closing between an input section of the amplifier 22 and an earth line (which is a high frequency earth line and may be either of positive and negative power supply lines), the amplifier 22 being composed of a field effect transistor (FET) Q10 serving as amplifier means configuring the oscillating unit 21; the resonator 23 is configured as a so called π-type resonator between an inductor L13 and each of capacitors C11 and C12; and a feedback circuit 24 which applies a positive feedback from an output side of the resonator 23 to an input section of the amplifier 22 is connected.

The oscillating unit 21 shown in FIG. 28 can be regarded as being configured to have the amplifier (means) 22 and both of the resonator 23 which resonates at the predetermined frequency and a feedback circuit 24 which applies the positive feedback from an output side of the resonator 23 to the input section of the amplifier 22 in order to contribute to oscillation at the predetermined frequency together with the amplifier (means) 22.

In FIG. 28, an inductor L11 and an inductor L12 are connected to a power supply (Vd) for the switch 30 composed of the diode D1 and a power supply (Vg) line for the amplifier 22 composed of the FET, and a coupler capacitor C13 for outputting an oscillation signal having a predetermined frequency is connected to an output side of the resonator 23.

In the radar oscillator 20 shown in FIG. 28, instead of the above-described switch 30A or as a plurality of switches which can be selectively combined with each other as indicated by the illustrative dashed line, there may be provided alone or in predetermined combination: a switch 30B for opening and closing the output side of the amplifier 22 composed of the FET Q10; and a switch 30C for opening and closing the power supply (Vd) for the amplifier 22 composed of the FET Q10.

Further, in the radar oscillator 20 shown in FIG. 28, instead of the above switch 30A or as a plurality of switches which can be selectively combined with each other as indicated by the illustrative dashed line, a switch 30D for connecting and disconnecting an element for setting a resonance frequency of the resonator 23 outside of an oscillation enable range with respect to the resonator 23 based on the pulse signal indicating the transmission timing of the radar wave may be provided along or in predetermined combination with each of the above-described switches 30A, 30B, and 30C.

In the radar oscillator 20 shown in FIG. 28, the switch 30D for connecting or disconnecting the element for setting the resonance frequency of the resonator 23 with respect to the resonator 23 based on the pulse signal indicating the transmission timing of the radar wave in the radar oscillator 20 shown in FIG. 28 will be described in detail in a radar oscillator 20 of a third embodiment of the present invention shown in FIG. 6 described later.

Figure 29:
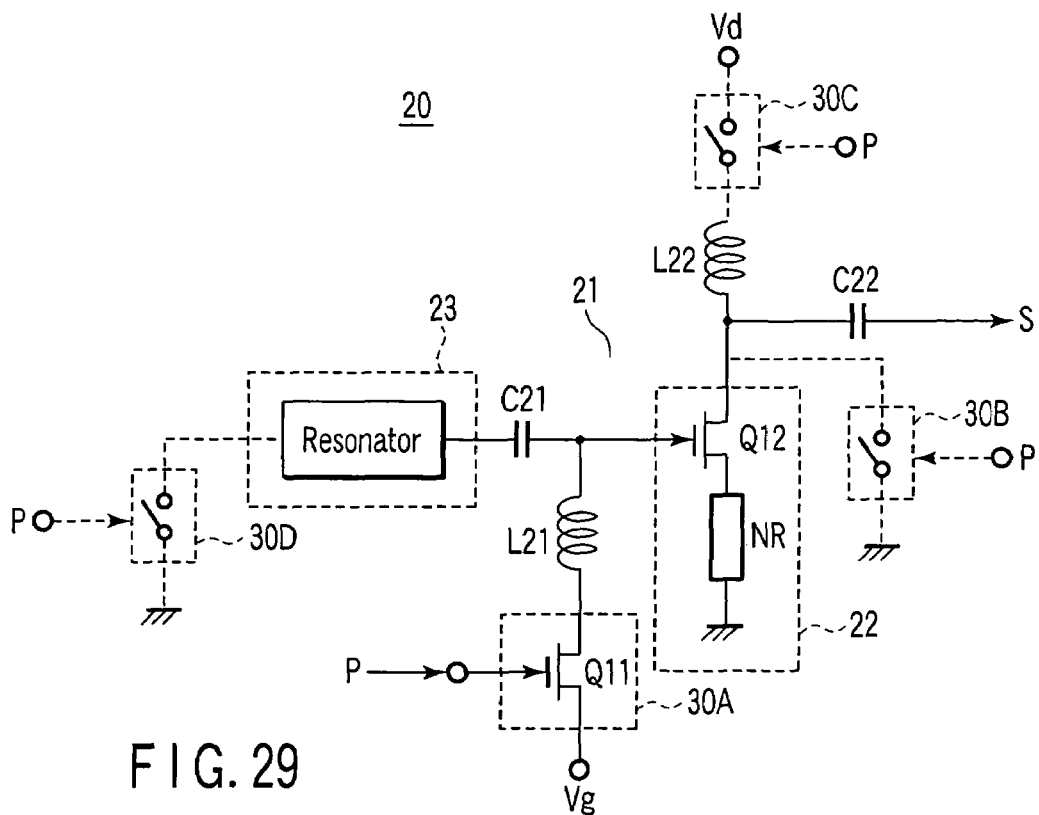
FIG. 29 is a block diagram depicting a specific circuit configuration of a modified example of the radar oscillator according to the first embodiment shown in FIG. 1.

FIG. 29 is a diagram showing a specific circuit configuration of a modified example of the radar oscillator 20 according to the first embodiment of the present invention shown in FIG. 1.

The radar oscillator 20 shown in FIG. 29 is configured in the same way as in the radar oscillator 20 shown in FIG. 1 except that, when an amplifier (means) 22 of an oscillating unit 21 is composed of: a field effect transistor (FET) Q12; and a distributed parameter line NR connected to the FET Q12, the distributed parameter line NR having a length such that the FET Q12 generates a negative resistance which contributes to oscillation at a predetermined frequency, the radar oscillator 20 has a resonator 23 which resonates the predetermined frequency, the resonator 23 being composed of a distributed parameter line connected to the input section of the FET Q12, the distribution constant line channel having a length of equal to λ/4 of the predetermined frequency; another field effect transistor (FET) Q11 is used as a switch 30A for opening or closing the input section of the FET Q12 with respect to a power supply (Vg) line serving as a high frequency earth line; and the radar oscillator 20 is configured to output and stop an oscillation signal having a predetermined frequency determined by the resonator 23 from the output side of the FET Q12 as the amplifier (means) 22 in the oscillating state and oscillation stop state of the oscillating unit 21.

The oscillating unit 21 shown in FIG. 29 can be regarded as being configured to have: the amplifier (means) 22 composed of the FET Q12 and the distributed parameter line NR having the length such that the FET Q12 generates the negative resistance which contributes to oscillation at the predetermined frequency; and only the resonator 23 which resonates at the predetermined frequency in order to contribute to the predetermined frequency together with the amplifier (means) 22.

In FIG. 29, an inductor L21 and an inductor L22 are connected to a power supply (Vg) for the switch 30A composed of the FET Q11 and a power supply (Vd) line for the amplifier 22 composed of the FET Q12, a coupler capacitor C22 is connected between the resonator 23 and the input side of the amplifier 22 composed of the FET, and a coupler capacitor C22 for outputting an oscillation signal having a predetermined frequency is connected to an output side of the amplifier 22 composed of the FET.

In the radar oscillator 20 shown in FIG. 29, instead of the above switch 30A or as a plurality of switches which can be selectively combined with each other as indicated by the illustrative dashed line with, a switch 30B for opening or closing the output side of the amplifier 22 composed of the FET Q12 respect to a high frequency earth line, and a switch 30C for opening or closing the power supply (Vd) for the amplifier 22 composed of the FET Q12 may be provided alone or predetermined combination, respectively.

Further, in the radar oscillator 20 shown in FIG. 29, instead of the above switch A30 or as a plurality of switches which can be selectively combined with each other as indicated by the illustrative dashed line, a switch 30D for connecting or disconnecting an element for setting a resonance frequency of the resonator 23 with respect to the resonator 23 based on the pulse signal indicating the transmission timing of the radar wave may be provided in predetermined combination with each of the above-described switches 30A, 30B, and 30C.

In the radar oscillator 20 shown in FIG. 29, the switch, 30D for connecting or disconnecting the element for setting the resonance frequency of the resonator 23 outside of the oscillation enable range with respect to the resonator 23 based on the pulse signal indicating the transmission timing of the radar wave will be described in detail in a radar oscillator 20 according to a third embodiment of the present invention shown in FIG. 6 described later.

Second Embodiment

Figure 4:
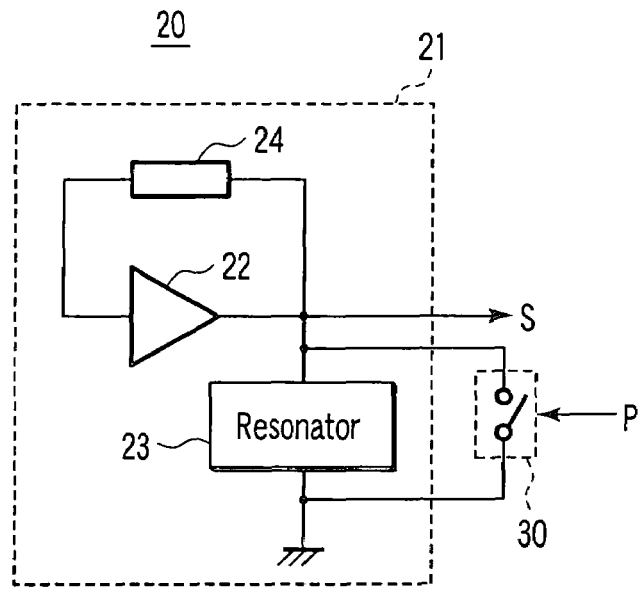
FIG. 4 is a block diagram depicting a schematic configuration of a radar oscillator according to a second embodiment of the present invention.

FIG. 4 is a block diagram depicting a schematic configuration of a radar oscillator 20 according to a second embodiment of the present invention.

Figure 5:
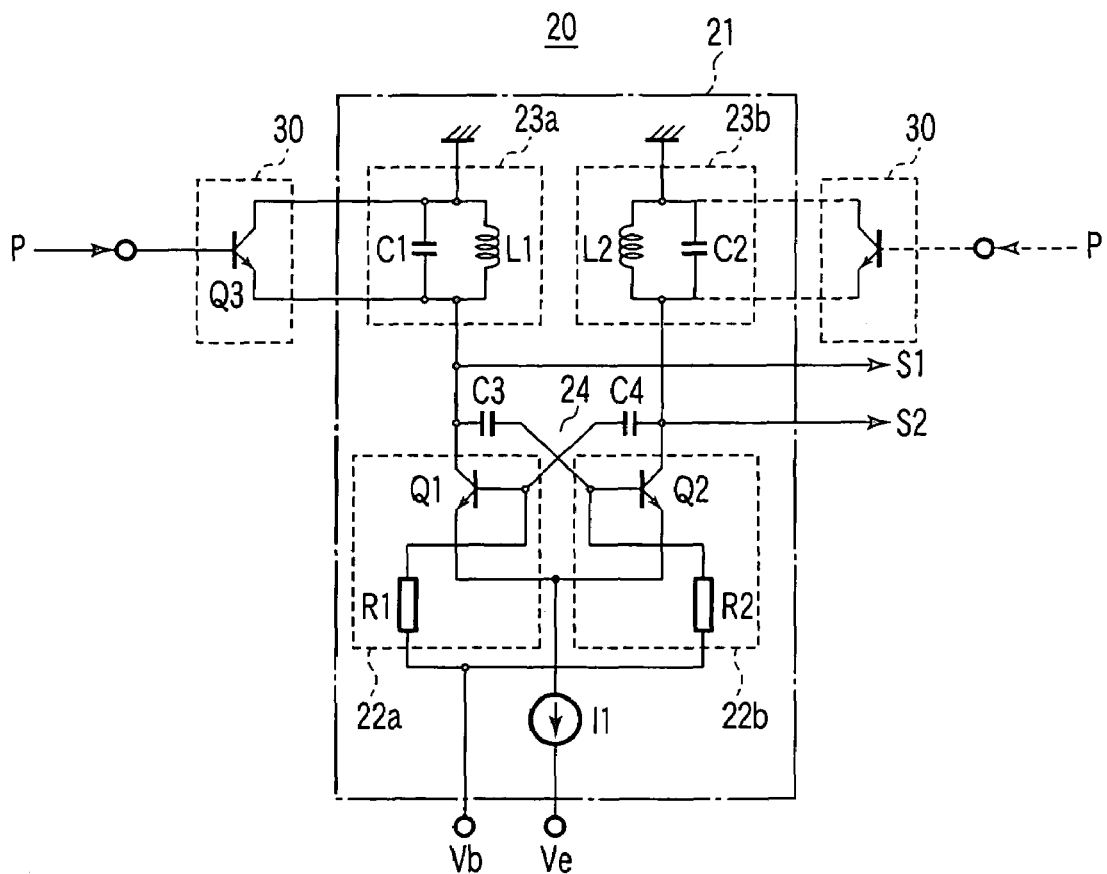
FIG. 5 is a diagram showing a specific circuit configuration of the radar oscillator according to the second embodiment shown in FIG. 4.

FIG. 5 is a block diagram depicting a specific circuit configuration of the radar oscillator 20 according to the second embodiment shown in FIG. 4.

In FIGS. 4 and 5, like elements of the radar oscillator 20 according to the present embodiment shown in FIG. 1 and FIG. 2 described previously are designated by like reference numerals, and a detailed description of the duplicate elements is omitted here.

In the above-described radar oscillator 20 according to the first embodiment, the switch 30 is connected between the input side of the amplifier 20 and the earth line, whereby a positive feedback is not applied to the oscillating unit 21 in a state in which the switch 30 is closed.

In contrast, in the radar oscillator 20 according to the second embodiment shown in FIGS. 4 and 5, the switch 30 is connected between the output side of the amplifier 22 (which may be the input side of the amplifier 22 as shown in a modified example described later) and the earth line, i.e., in parallel to the resonator 23, whereby a positive feedback is not applied to the oscillating unit 21 in a state in which the switch 30 is closed.

In this case, the switch 30 is closed by the pulse signal P, and the output side of the amplifier 22 is connected to the earth line (the resonator 23 is short-circuited), whereby a positive feedback is not applied to the input side of the amplifier 22 in the same manner as that described previously, and the oscillating unit 21 enters an oscillation stop state.

In the specific circuit configuration shown in FIG. 5, although the switches 30 are connected in parallel to one resonator 23a, the switches 30 may be connected in parallel to the other resonator 23b, as indicated by the dashed line.

In addition, two switches 30 connected in parallel to the two resonators 23a and 22b, respectively, may be configured to be turned on/off by means of a common pulse signal P.

Figure 18:
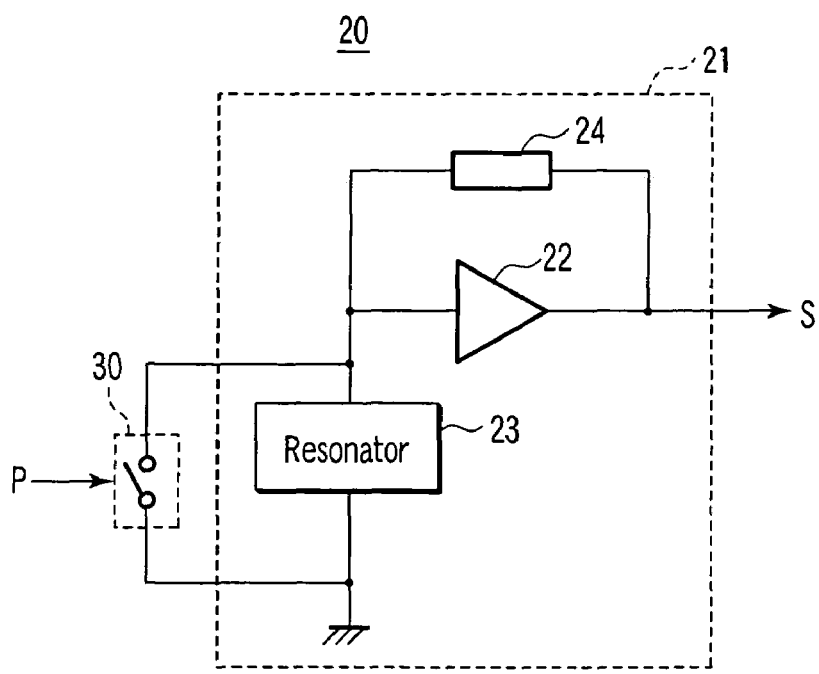
FIG. 18 is a block diagram depicting a schematic configuration of a modified example of the radar oscillator according to the second embodiment shown in FIG. 4.

FIG. 18 is a block diagram depicting a schematic configuration of a modified example of the radar oscillator 20 according to the second embodiment of the present invention shown in FIG. 4.

In the radar oscillator 20 shown in FIG. 18, the switch 30 is connected between the input side of the amplifier 22 and earth line, i.e., in parallel to the resonator 23 connected to the input side of the amplifier 22, instead of the output side of the amplifier 22, as described previously. In this manner, the radar oscillator 20 shown in FIG. 18 is basically configured in the same way as in the radar oscillator 20 shown in FIG. 4 except that a positive feedback is not configured to be applied to the oscillating unit 21 in a state in which the switch 30 is closed.

FIG. 32 is a diagram showing a specific circuit configuration of a modified example of the radar oscillator 20 according to the second embodiment of the present invention shown in FIG. 4.

The radar oscillator 20 shown in FIG. 32 is basically configured in the same way as in the radar oscillator 20 shown in FIG. 4 except a simple configuration in which the bias power supply Vb can be eliminated in the radar oscillator 20 shown in FIG. 4.

As described above, it becomes possible to intermittently output an oscillation signal without producing a leak in response to a pulse signal indicating a transmission timing of a radar wave by the radar oscillator according to the second embodiment of the present invention.

Third Embodiment

Figure 6:
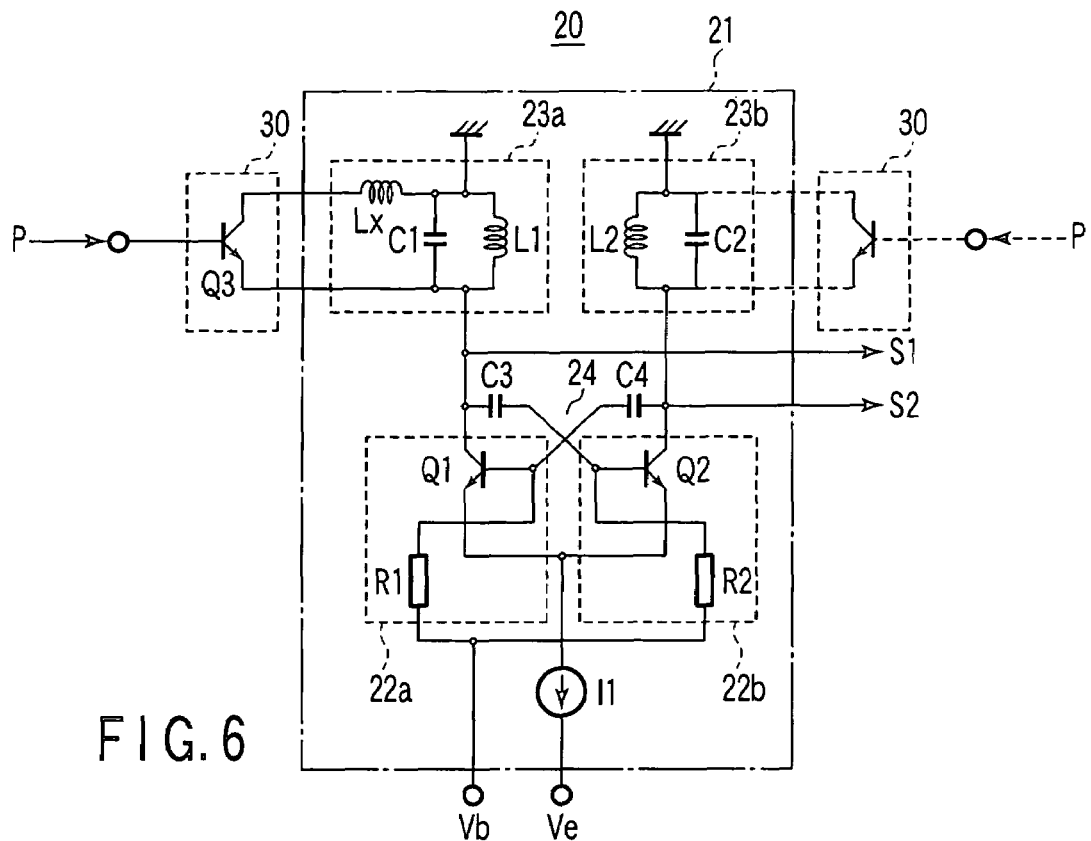
FIG. 6 is a diagram illustrating a specific circuit configuration of a radar oscillator according to a third embodiment of the present invention.

FIG. 6 is a diagram showing a specific circuit configuration of essential portions of a radar oscillator 20 according to a third embodiment of the present invention.

In the above-described radar oscillator 20 according to the first and second embodiments, at least one of the input section and the output section of the amplifier 22 and the high frequency earth line of the oscillating unit 21 is opened or closed by the switch based on the pulse signal indicating the transmission timing of the radar wave, whereby the operating state of the oscillating unit 21 is alternately switched between the oscillating state and the oscillation stop state.

That is, in the above-described radar oscillator 20 according to the first and second embodiments, the positive feedback loop including the feedback circuit 24 is substantially connected to the earth line by the switch so as not to apply a positive feedback in the oscillation stop state.

In the meantime, in the case of the oscillating unit 21 having the two resonators 23a and 23b as described above, one oscillating condition is that the resonance frequencies of both of the resonators 23a and 23b are equal to each other.

Therefore, in the radar oscillator 20 according to the third embodiment, the resonance frequency of one resonator is switched to a frequency which greatly deviates from a desired oscillation frequency, whereby a positive feedback is not applied.

That is, in the radar oscillator 20 according to the third embodiment, as shown in FIG. 6, a coil Lx is connected to one resonator 23a by the switch 30, and the resonance frequency of the resonator 23a is increased more significantly than the resonance frequency of the other resonator 23b (not shown), whereby an oscillating operation is stopped so as not to apply a positive feedback.

A technique of changing the resonance frequency of the resonator outside of the oscillation enable range so as not to apply a positive feedback can be applied to also a case of one resonator is provided as shown in a modified example described later as well as an oscillator having two resonators 23a and 23b as described above.

Then, in the radar oscillator 20 according to the first to third embodiments as described above, a positive feedback is not sufficiently applied to the input side of the amplifier (means) 22, respectively, whereby the oscillation stop state is established. However, the amplifier (means) 22 itself is constantly in an active state. Therefore, an intermittent output of an oscillation signal in response to the level of the pulse signal P becomes possible without producing a leak while high speed responsiveness is maintained in response to the changeover of the switch 30.

Figure 17:
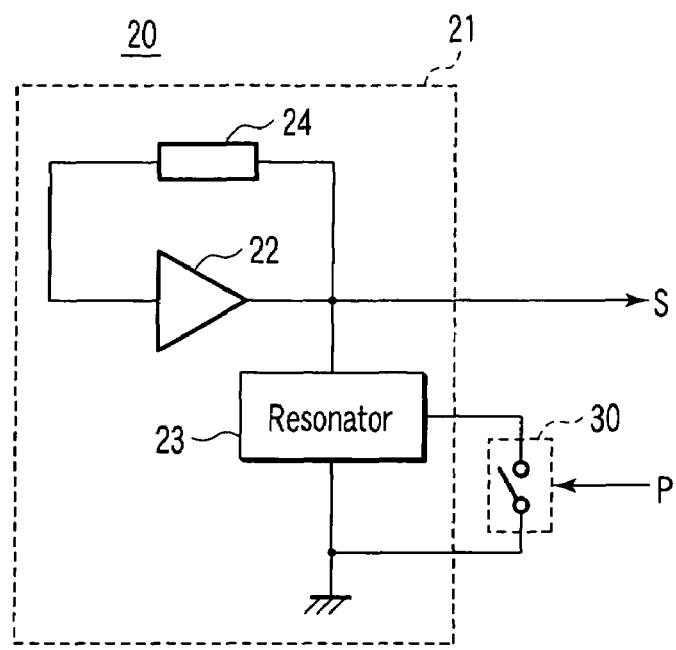
FIG. 17 is a block diagram depicting a schematic configuration of a modified example of the radar oscillator according to the third embodiment shown in FIG. 6.

FIGS. 16 and 17 are block diagrams each depicting a schematic configuration of a modified example of the radar oscillator 20 according to the third embodiment of the present invention shown in FIG. 6.

The radar oscillator 20 shown in FIGS. 16 and 17 is configured in the same way as in the radar oscillator 20 shown in FIG. 6 except that a technique of changing the resonance frequency of the resonator outside of the oscillation enable range so as not to apply a positive feedback can be applied to one resonator 22 connected to the input side or the output side of the amplifier 22, as described previously.

FIG. 31 is a diagram showing a specific circuit configuration of a modified example of the radar oscillator 20 according to the third embodiment of the present invention shown in FIG. 6.

The radar oscillator 20 shown in FIG. 31 is basically configured in the same way as in the radar oscillator 20 shown in FIG. 6 except a simple configuration in which the bias power supply Vb can be eliminated in the radar oscillator 20 shown in FIG. 6.

As described above, it becomes possible to intermittently output an oscillation signal without producing a leak in response to a pulse signal indicating a transmission timing of a radar wave by the radar oscillator according to the third embodiment of the present invention.

Fourth Embodiment

Figure 7:
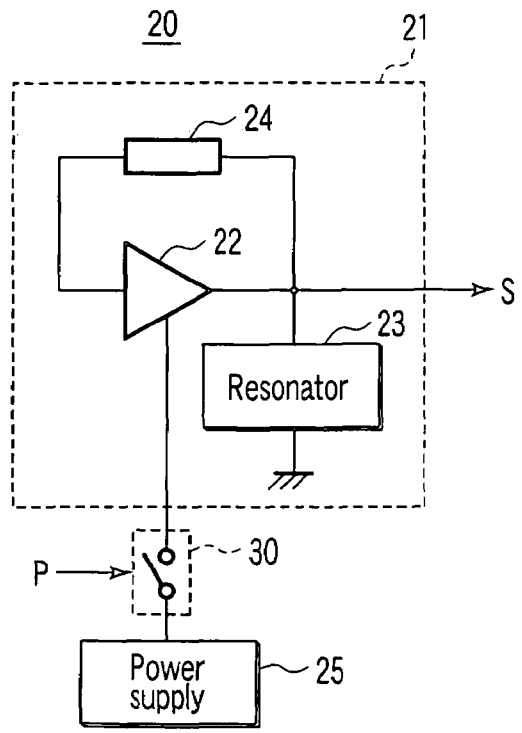
FIG. 7 is a block diagram depicting a schematic configuration of a radar oscillator according to a fourth embodiment of the present invention.

FIG. 7 is a block diagram depicting a schematic configuration of a radar oscillator 20 according to a fourth embodiment of the present invention.

Figure 8:
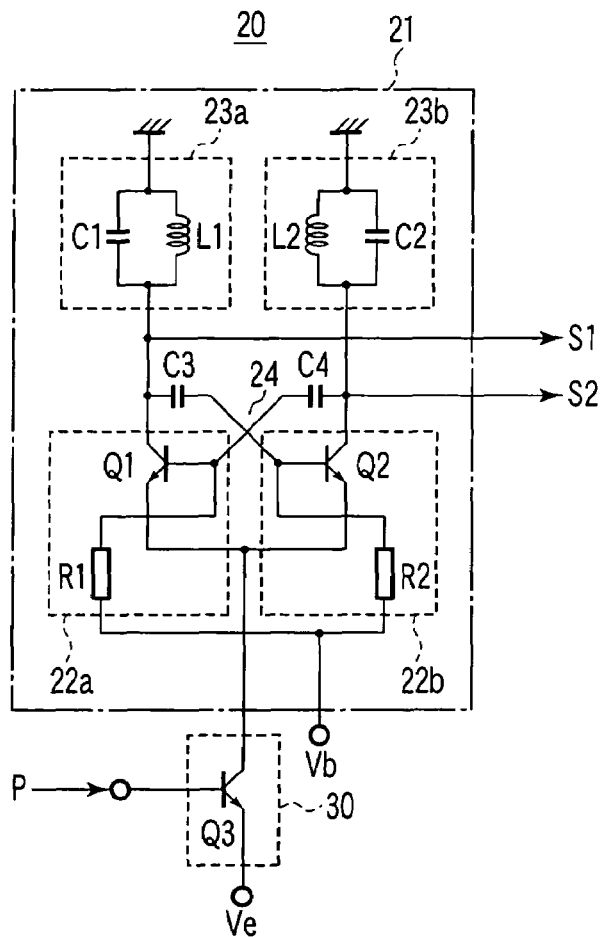
FIG. 8 is a diagram showing a specific circuit configuration of the radar oscillator according to the forth embodiment shown in FIG. 7.

FIG. 8 is a diagram illustrating a specific circuit configuration of the radar oscillator 20 according to the fourth embodiment shown in FIG. 7.

In FIGS. 7 and 8, like elements of the radar oscillator according to the first embodiment shown in FIGS. 1 and 2 described previously are designated by like reference numerals, and a detailed description of duplicate elements is omitted.

That is, in the radar oscillator 20 according to the fourth embodiment shown in FIGS. 7 and 8, the switch 30 is connected to a power supply line of the amplifier 22 of the oscillating unit 21 so as to restrict supply of a power 25 for the amplifier 22 (including a bias power) and stop an oscillating operation.

Specifically, as shown in FIG. 8, the switch 30 composed of the transistor Q3 is used instead of the constant current source I1 of FIG. 2, the transistor Q3 is turned on/off by the pulse signal P, and the negative power supply Ve is restricted, whereby the oscillating unit 21 is alternately switched between the oscillating state and the oscillation stop state, and an oscillation signal is intermittently output.

Although not shown, supply of the bias power supply Vb is restricted by the switch 30, whereby an oscillation signal may be intermittently output.

Figure 30:
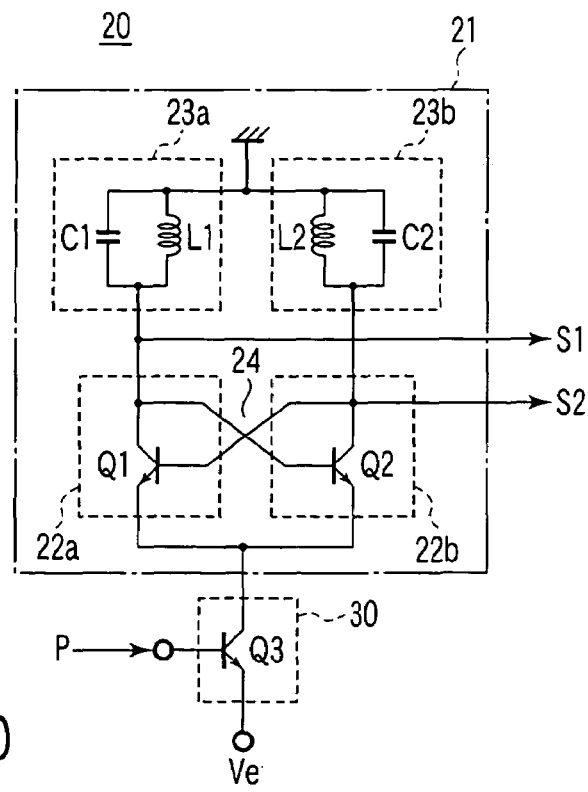
FIG. 30 is a block diagram depicting a specific circuit configuration of a modified example of the radar oscillator according to the fourth embodiment shown in FIG. 7.

FIG. 30 is a diagram showing a specific circuit configuration of a modified example of the radar oscillator 20 according to the fourth embodiment of the present invention shown in FIG. 7.

The radar oscillator 20 shown in FIG. 30 is basically configured in the same way as in the radar oscillator 20 shown in FIG. 8 except a simple configuration in which the bias power supply Vb can be eliminated in the radar oscillator 20 shown in FIG. 8.

As described above, it also becomes possible to intermittently output an oscillation signal in response to a pulse signal indicating a transmission timing of a radar wave without producing a leak by the radar oscillator 20 according to the fourth embodiment of the present invention.

Fifth Embodiment

Figure 9:
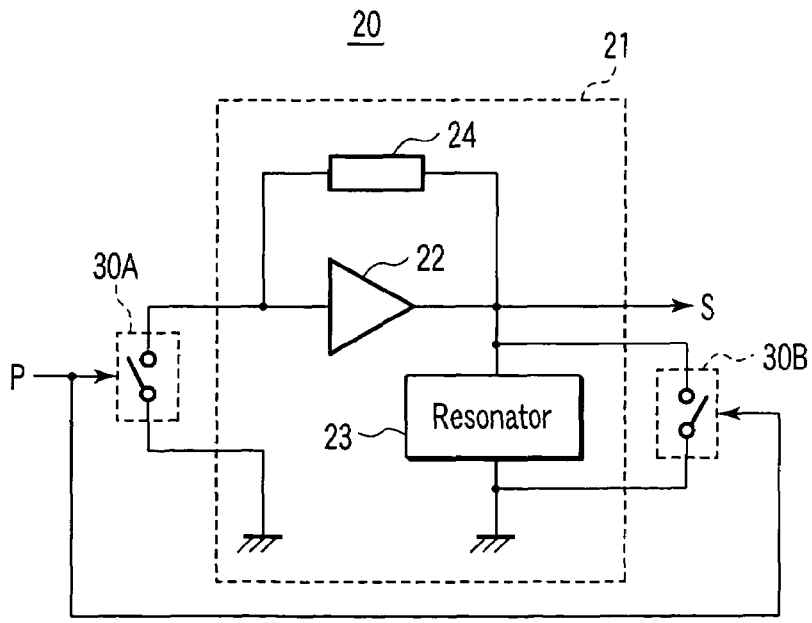
FIG. 9 is a block diagram depicting a schematic configuration of a radar oscillator according to a fifth embodiment of the present invention.

FIG. 9 is a block diagram depicting a schematic configuration of a radar oscillator 20 according to a fifth embodiment of the present invention.

In FIG. 9, like elements of the radar oscillator 20 according to the first embodiment shown in FIG. 1 described previously are designated by like reference numerals, and a detailed description of duplicate elements is omitted here.

In the above-described embodiments, the oscillating unit 21 is alternately switched between the oscillating state and the oscillation stop state by a single switch 30.

In contrast, in the radar oscillator 20 according to the fifth embodiment shown in FIG. 9, a plurality of switches 30 according to the above-described embodiments are selectively combined with each other, so that the oscillating unit 21 is alternately switched between the oscillating state and the oscillation stop state by the plurality of switches 30.

That is, in the radar oscillator 20 shown in FIG. 9, the input section and output section of the amplifier 22 (both ends of the resonator 23) are connected to the earth line by first and second switches 30A and 30B, respectively, whereby a positive feedback is not applied to the oscillating unit 21, and the oscillating unit 21 is alternately switched between the oscillating state and the oscillation stop state so as to intermittently output an oscillation signal.

Figure 10:
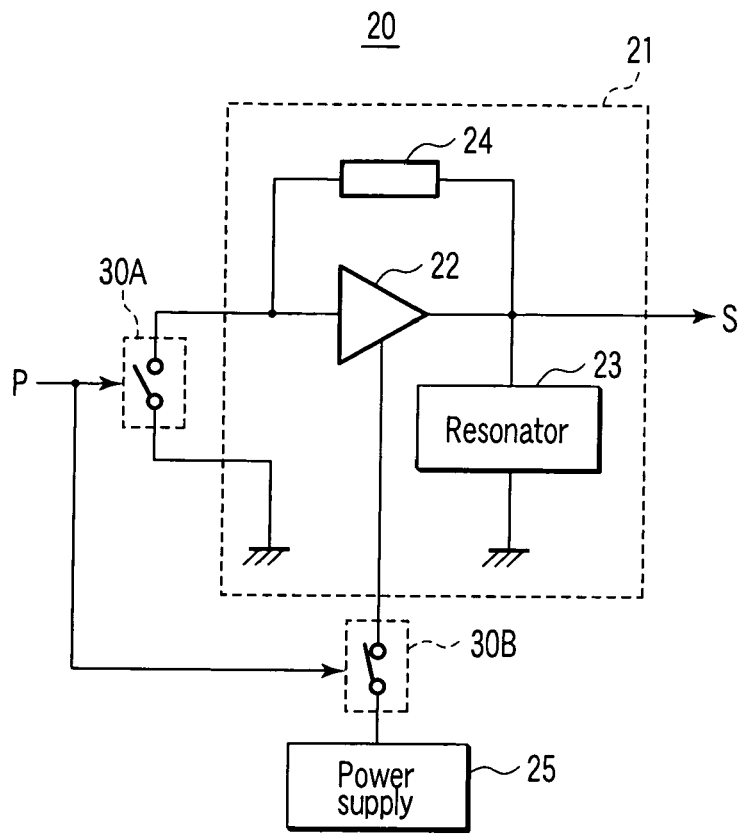
FIG. 10 is a block diagram depicting a schematic configuration of a modified example of the radar oscillator according to the fifth embodiment of the present invention shown in FIG. 9.
Figure 11:
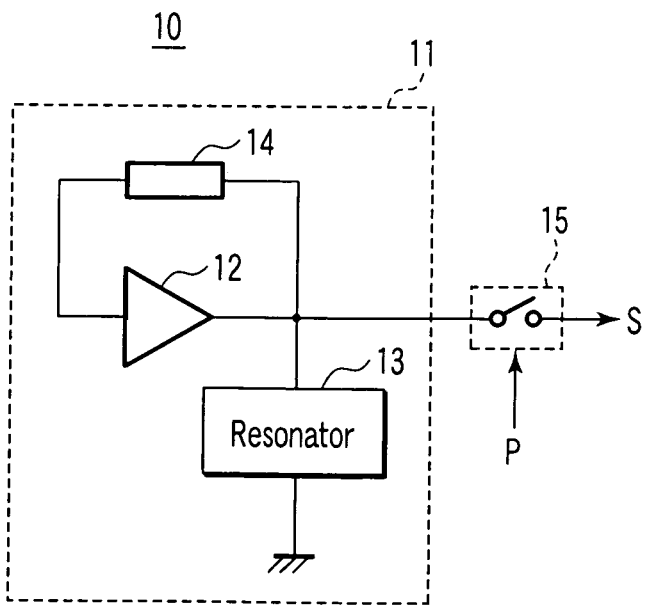
FIG. 11 is a block diagram depicting a schematic configuration of a conventional radar oscillator.
Figure 12A:
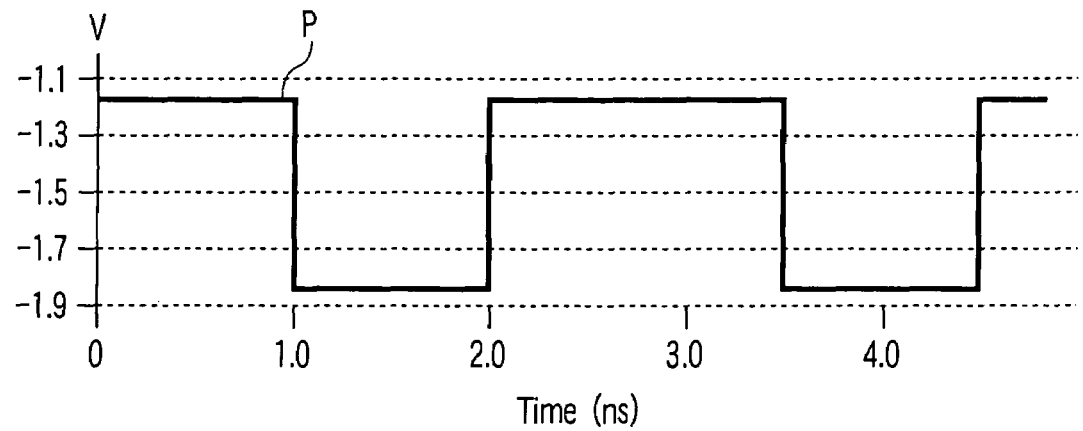
FIG. 12A is a timing chart of a pulse signal provided to explain an operation of the conventional radar oscillator shown in FIG. 11.
Figure 12B:
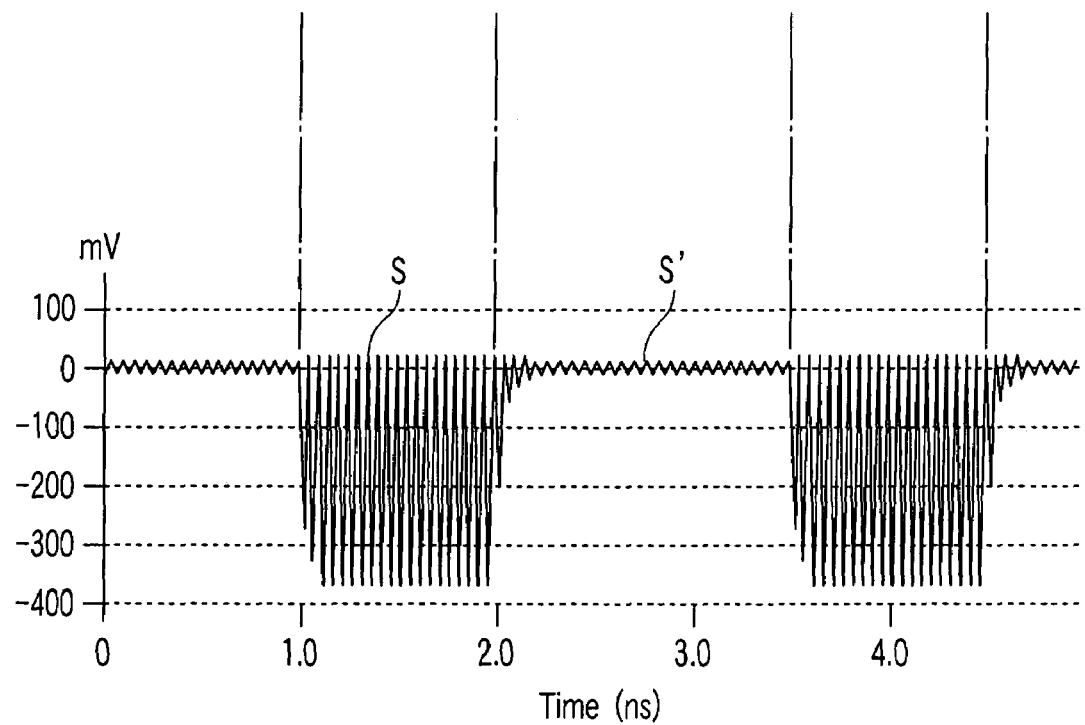
FIG. 12B is an output timing chart of an oscillation signal provided to explain an operation of the conventional radar oscillator shown in FIG. 11.

FIG. 10 is a block diagram depicting a schematic configuration of a modified example of the radar oscillator 20 according to the fifth embodiment of the present invention shown in FIG. 9.

The radar oscillator 20 shown in FIG. 10 is basically configured in the same way as in the radar oscillator 20 shown in FIG. 9 except that the input section of the amplifier 22 (which may be the output section of the amplifier 22 as shown in another modified example described later) is connected to the earth line by the first switch 30A, and supply of the power 25 to the amplifier 22 is stopped by the second switch 30B.

With respect to a combination of the plurality of switches 30 for use in the present invention, another combination other than the above-described one may be used as shown in a modified example described later.

Figure 19:
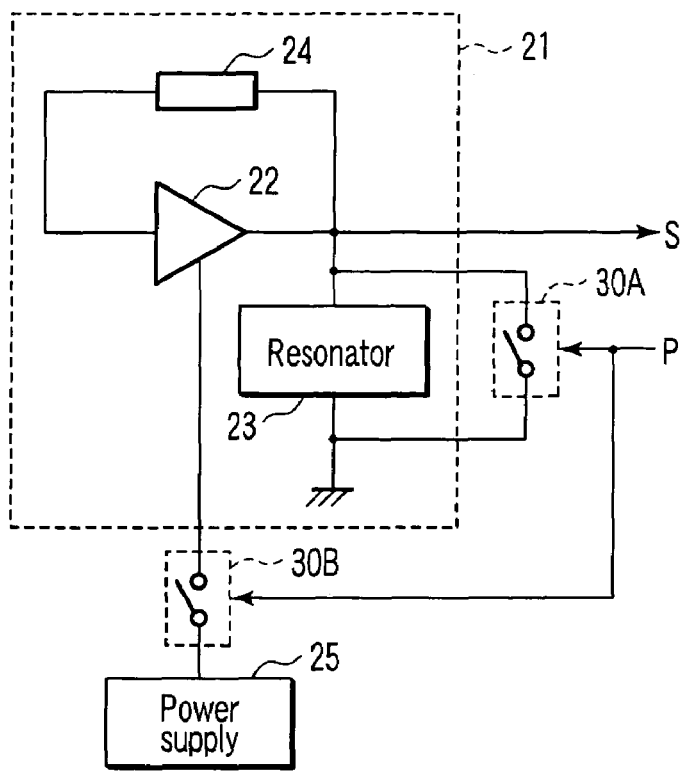
FIG. 19 is a block diagram depicting a schematic configuration of a modified example of the radar oscillator according to the fifth embodiment shown in FIG. 9.

FIG. 19 is a block diagram depicting a schematic configuration of a modified example of the radar oscillator 20 according to the fifth embodiment of the present invention shown in FIG. 9.

The radar oscillator 20 shown in FIG. 19 is basically configured in the same way as in the radar oscillator 20 shown in FIGS. 9 and 10 except that the output section of the amplifier 22 is connected to the earth line by the first switch 30A, and the supply of power 25 to the amplifier 22 is stopped by the second switch 30B.

Figure 20:
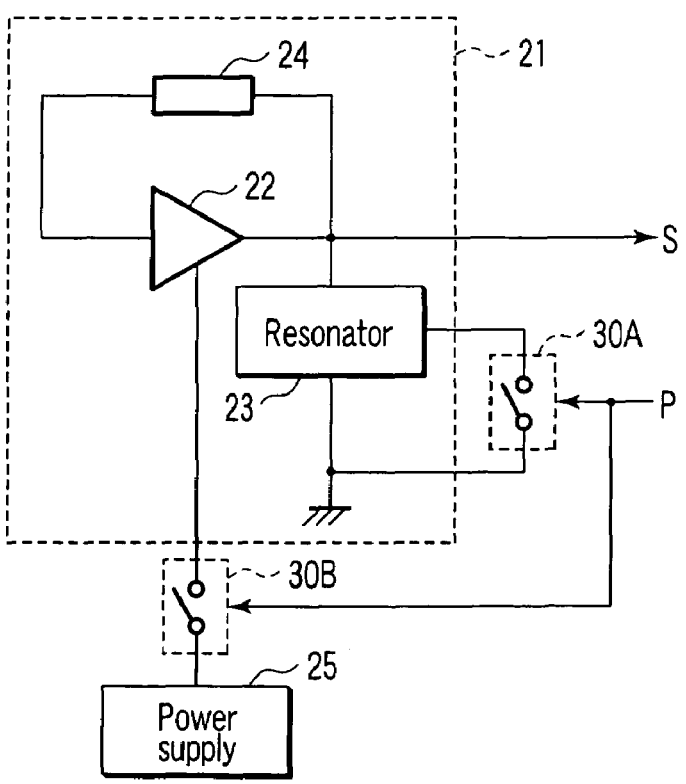
FIG. 20 is a block diagram depicting a schematic configuration of a modified example of the radar oscillator according to the fifth embodiment shown in FIG. 9.

FIG. 20 is a block diagram depicting a schematic configuration of a modified example of the radar oscillator 20 according to the fifth embodiment of the present invention shown in FIG. 9.

The radar oscillator 20 shown in FIG. 20 is basically configured in the same way as in the radar oscillator 20 shown in FIGS. 9 and 10 except that, as shown in FIG. 17, the element for setting the resonance frequency of the resonator 23 in the oscillating unit 21 outside of the oscillation enable range is connected to or disconnected from the resonator 23 by the first switch 30A and the supply of the power 25 to the amplifier 22 is stopped by the second switch 30B.

Figure 21:
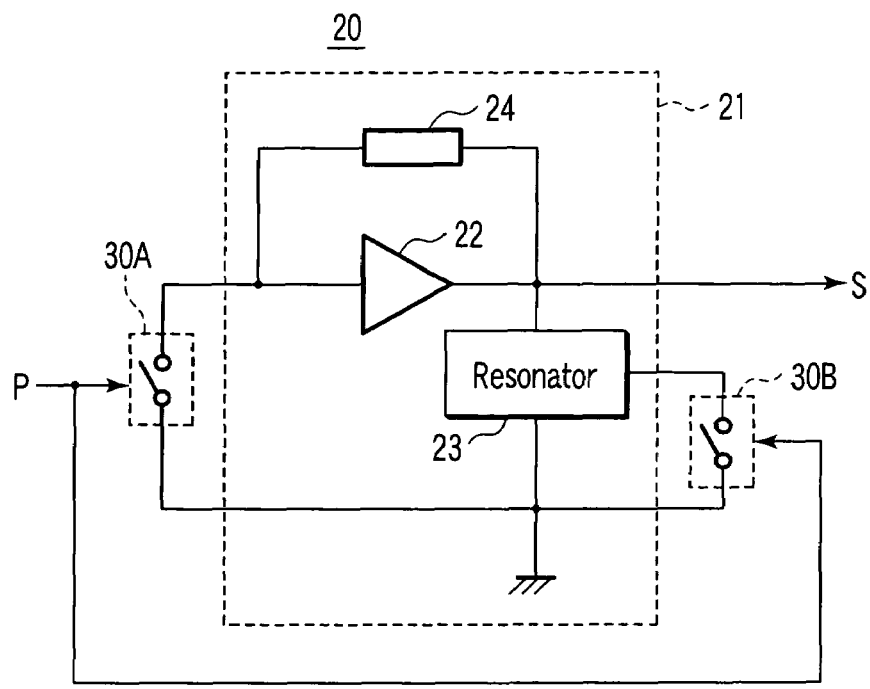
FIG. 21 is a block diagram depicting a schematic configuration of a modified example of the radar oscillator according to the fifth embodiment shown in FIG. 9.

FIG. 21 is a block diagram depicting a schematic configuration of a modified example of the radar oscillator 20 according to the fifth embodiment of the present invention shown in FIG. 9.

The radar oscillator 20 shown in FIG. 21 is basically configured in the same way as in the radar oscillator 20 shown in FIG. 9 except that the input section of the amplifier 22 is connected to the earth line by the first switch 30A, and, as shown in FIG. 17, en element for setting a resonance frequency of the resonator 23 in the oscillating unit 21 outside of an oscillation enable range is connected to or disconnected from the resonator 23 by the second switch 30B.

Figure 22:
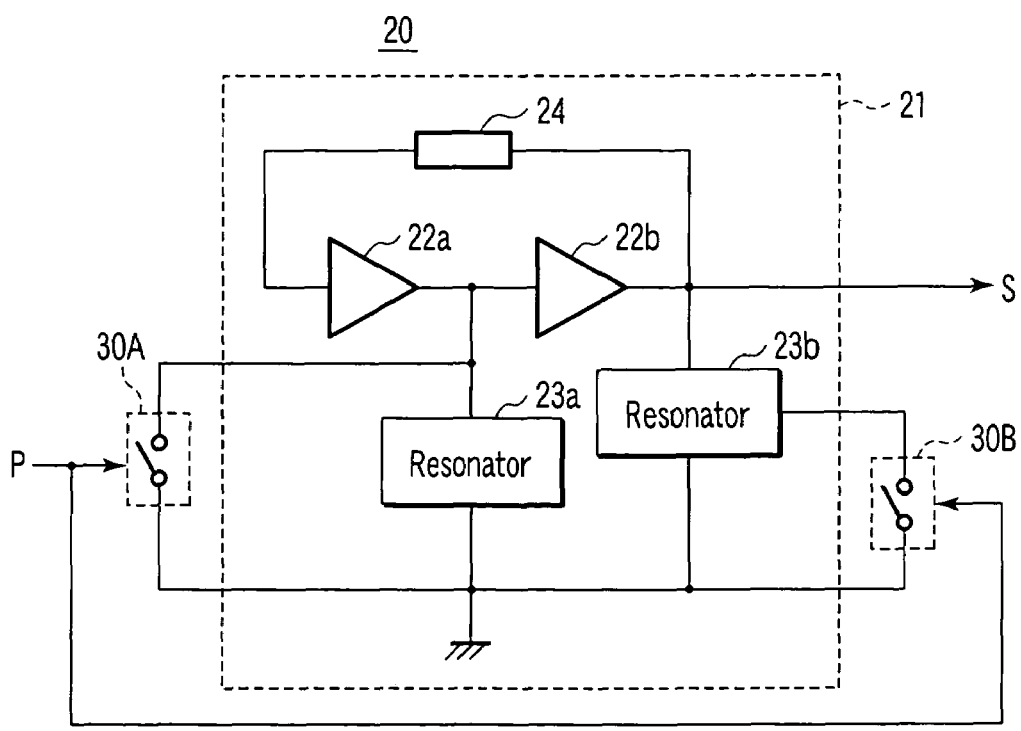
FIG. 22 is a block diagram depicting a schematic configuration of a modified example of the radar oscillator according to the fifth embodiment shown in FIG. 9.

FIG. 22 is a block diagram depicting a schematic configuration of a modified example of the radar oscillator 20 according to the fifth embodiment of the present invention shown in FIG. 9.

The radar oscillator 20 shown in FIG. 22 is basically configured in the same way as in the radar oscillator 20 shown in FIG. 9 except that, as shown in FIG. 14, in the case where a plurality of amplifiers 22a and 22b and a plurality of resonators 23a and 23b are provided, the cascade-connecting sections of the plurality of amplifiers 22a and 22b (which are connecting sections between the input section of the amplifier 22a and the output section of the amplifier 22b and which are both ends of the resonator 23a) are connected to the earth line by the first switch 30A, and, as shown in FIG. 17, the element for setting the resonance frequency of the resonator 23b connected to the output side of the amplifier 22b outside of the oscillation enable range is connected to or disconnected from the resonator 23b by the second switch 30B.

Figure 23:
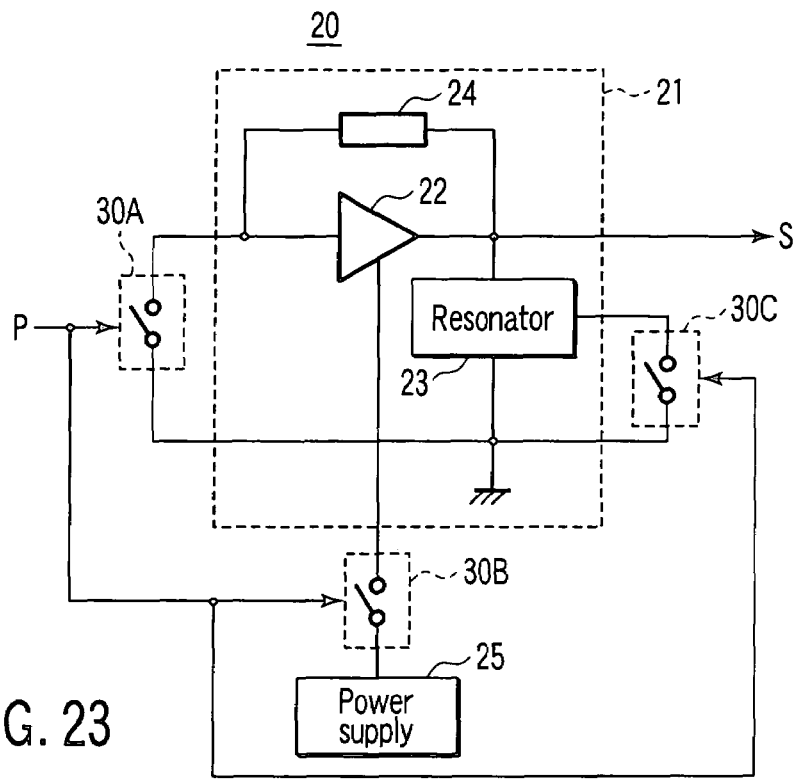
FIG. 23 is a block diagram depicting a schematic configuration of a modified example of the radar oscillator according to the fifth embodiment shown in FIG. 9.

FIG. 23 is a block diagram depicting a schematic configuration of a modified example of the radar oscillator 20 according to the fifth embodiment of the present invention shown in FIG. 9.

The radar oscillator 20 shown in FIG. 23 is basically configured in the same way as in the radar oscillator 20 shown in FIG. 9 except that the input section of the amplifier 22 is connected to the earth line by the first switch 30A; the supply of the power 25 to the amplifier 22 is stopped by the second switch 30B, and, as shown in FIG. 17, the element for setting the resonance frequency of the resonator 23 in the resonator section 21 outside of the oscillation enable range is connected to or disconnected from the resonator 23 by the third switch 30C.

Figure 24:
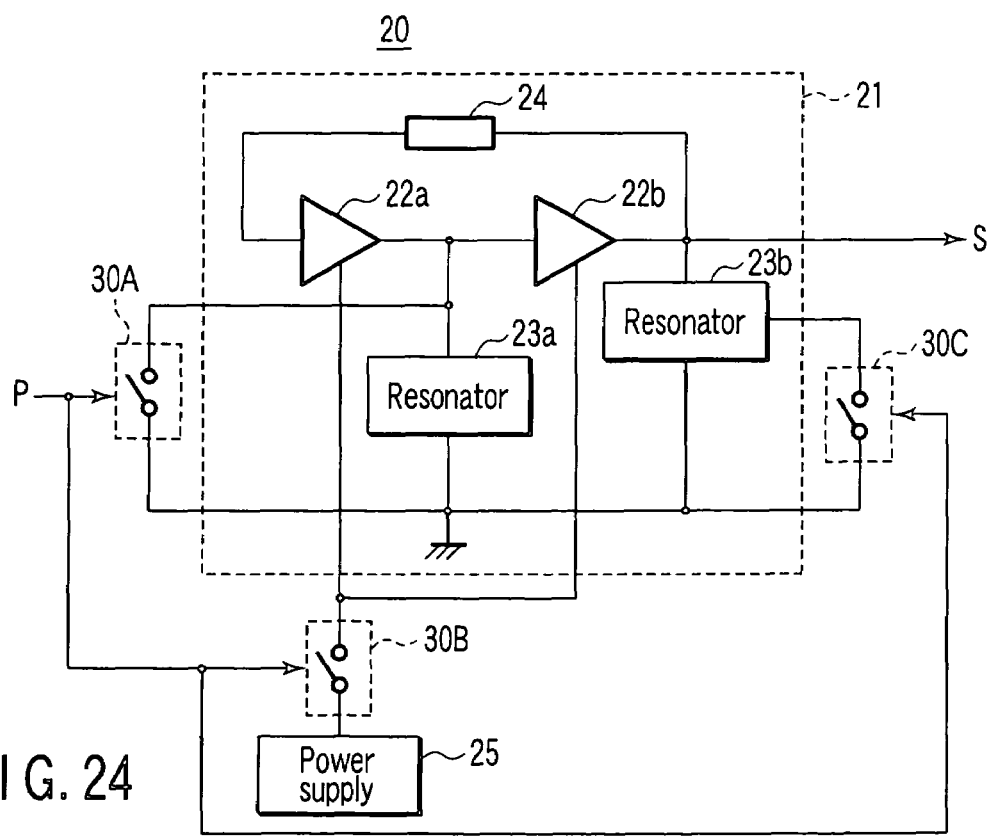
FIG. 24 is a block diagram depicting a schematic configuration of a modified example of the radar oscillator according to the fifth embodiment shown in FIG. 9.

FIG. 24 is a block diagram depicting a schematic configuration of a modified example of the radar oscillator 20 according to the fifth embodiment of the present invention shown in FIG. 9.

The radar oscillator 20 shown in FIG. 24 is basically configured in the same way as in the radar oscillator 20 shown in FIG. 9 except that, as shown in FIG. 14, in the case where a plurality of amplifiers 22a and 22b and a plurality of resonators 23a and 23b are provided, the cascade-connecting sections of the plurality of amplifiers 22a and 22b (which are connecting sections between the input section of the amplifier 22a and the output section of the amplifier 22b and which are both ends of the resonator 23a) are connected to the earth line by the first switch 30A; the supply of the power 25 to the amplifiers 22a and 22b is stopped by the second switch 30B, and, as shown in FIG. 17, the element for setting the resonance frequency of the resonator 23b connected to the output side of the amplifier 22b outside of the oscillation enable range is connected to or disconnected from the resonator 23b by the third switch 30C.

Figure 25:
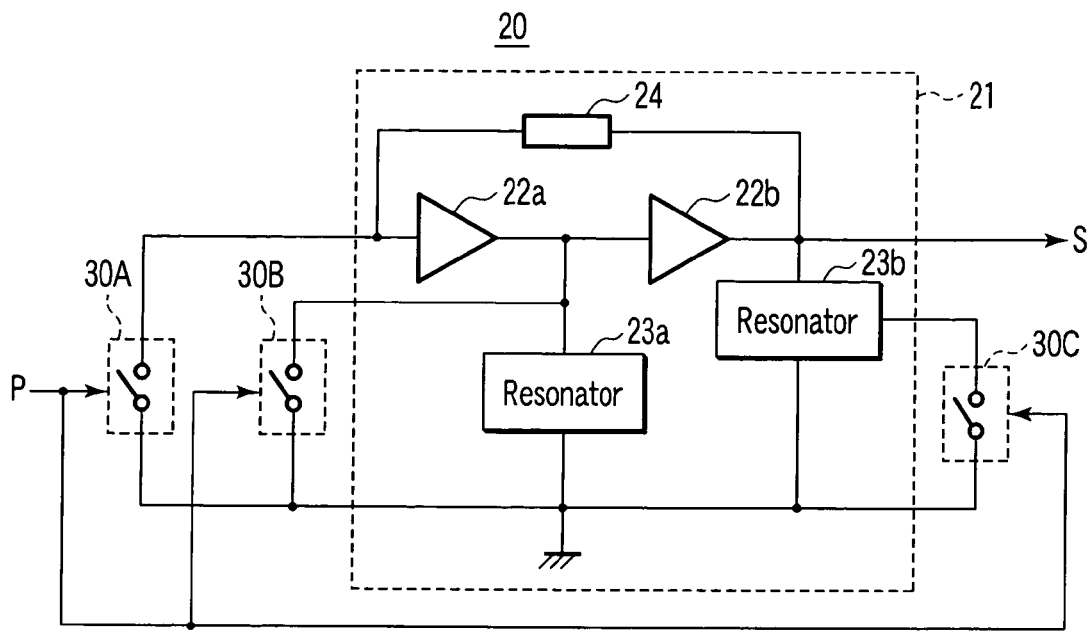
FIG. 25 is a block diagram depicting a schematic configuration of a modified example of the radar oscillator according to the fifth embodiment shown in FIG. 9.

FIG. 25 is a block diagram depicting a schematic configuration of a modified example of the radar oscillator 20 according to the fifth embodiment of the present invention shown in FIG. 9.

The oscillator 20 shown in FIG. 25 is basically configured in the same way as in the radar oscillator 20 shown in FIG. 9 except that, as shown in FIG. 14, in the case where a plurality of amplifiers 22a and 22b and a plurality of resonators 23a and 23b are provided, the input section of the amplifier 22a is connected to the earth line by the first switch 30A; the cascade connecting sections of the plurality of amplifiers 22a and 22b (which are connecting sections between the input section of the amplifier 22a and the output section of the amplifier 22b and which are both ends of the resonance 23a) are connected to the earth line by the second switch 30B; and, as shown in FIG. 17, the element for setting the resonance frequency of the resonator 23b connected to the output side of the amplifier 22b outside of the oscillation enable range is connected to or disconnected from the resonator 23b by the third switch 30C.

Figure 26:
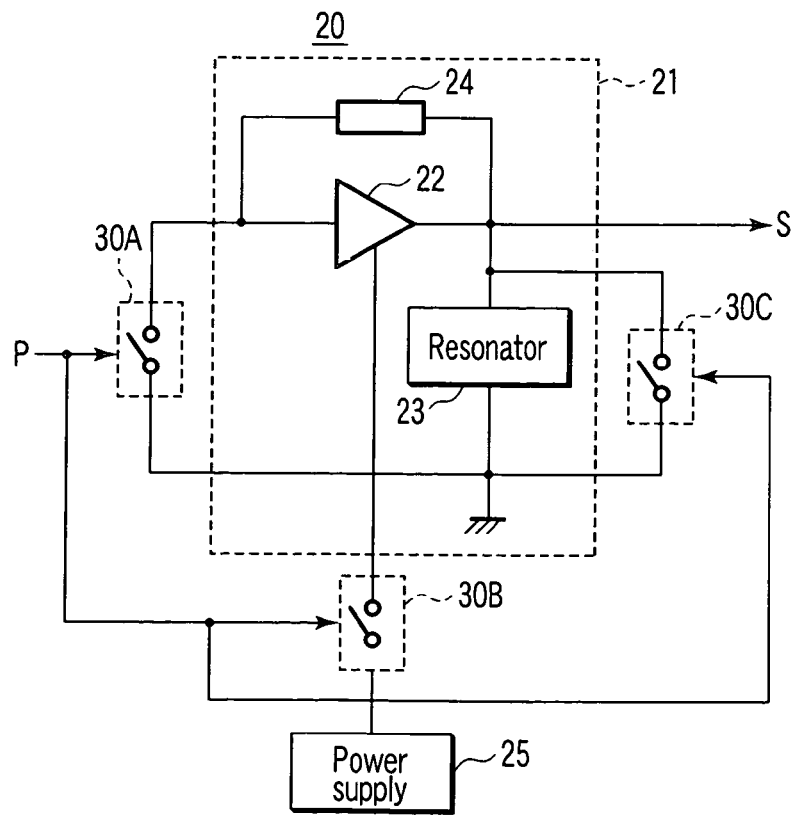
FIG. 26 is a block diagram depicting a schematic configuration of a modified example of the radar oscillator according to the fifth embodiment shown in FIG. 9.

FIG. 26 is a block diagram depicting a schematic configuration of a modified example of the radar oscillator 20 according to the fifth embodiment of the present invention shown in FIG. 9.

The radar oscillator 20 shown in FIG. 26 is basically configured in the same way as in the radar oscillator 20 shown in FIG. 9 except that the input section and the output section of the amplifier 22 (both ends of the resonator 23) are connected to the earth line by the first and third switches 30A and 30C, respectively, and the supply of the power 25 to the amplifier 22 is stopped by the second switch 30B.

Figure 27:
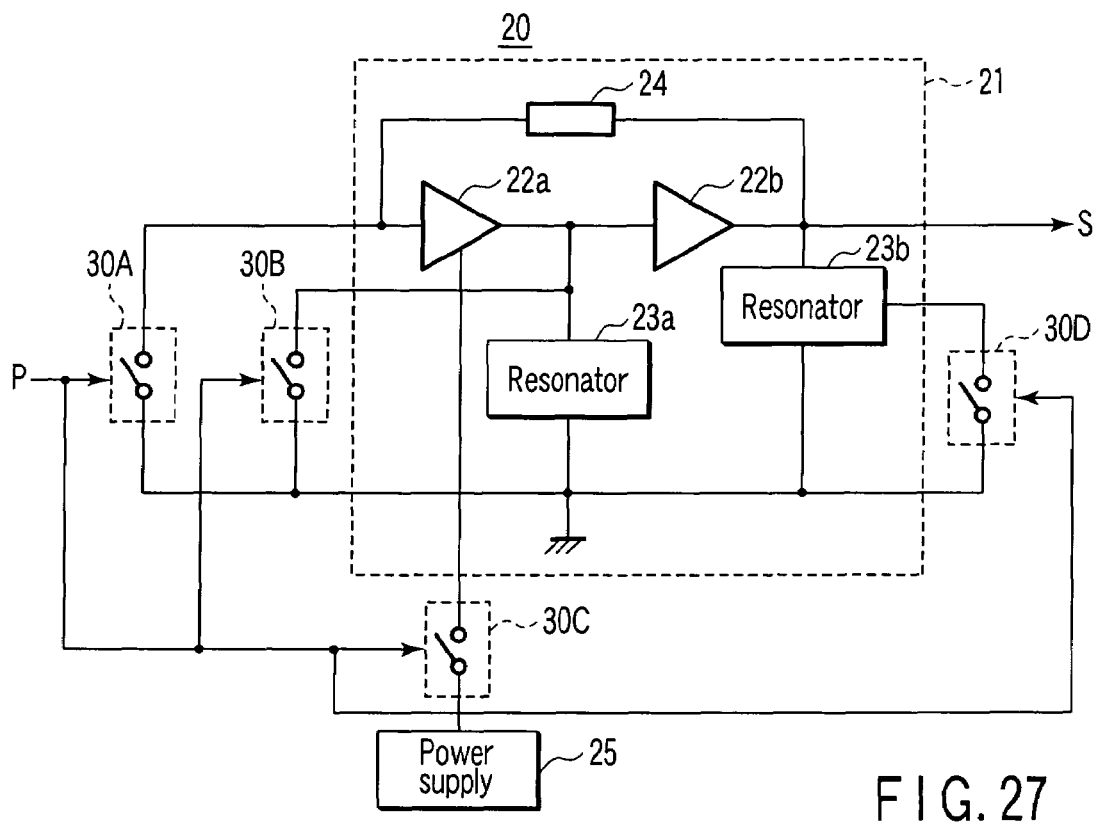
FIG. 27 is a block diagram depicting a schematic configuration of a modified example of the radar oscillator according to the fifth embodiment shown in FIG. 9.

FIG. 27 is a block diagram depicting a schematic configuration of a modified example of the radar oscillator 20 according to the fifth embodiment of the present invention shown in FIG. 9.

The radar oscillator 20 shown in FIG. 27 is basically configured in the same way as in the radar oscillator 20 shown in FIG. 9 except that, as shown in FIG. 14, in the case where a plurality of amplifiers 22a and 22b and a plurality of resonators 23a and 23b are provided, the input section of the amplifier 22a is connected to the earth line by the first switch 30A; the cascade-connecting sections of a plurality of amplifiers 22a and 22b (which are connecting sections between the input section of the amplifier 22a and the output section of the amplifier 22b and which are both ends of the resonator 23a) are connected to the earth line by the second switch 30B; the supply of the power 25 to the amplifiers 22a and 22b is stopped by the third switch 30C; and, as shown in FIG. 17, the element for setting the resonance frequency of the resonator 23b connected to the output side of the amplifier 22b outside of the oscillation enable range is connected to or disconnected from the resonator 23b by the fourth switch 30D.

Figure 33:
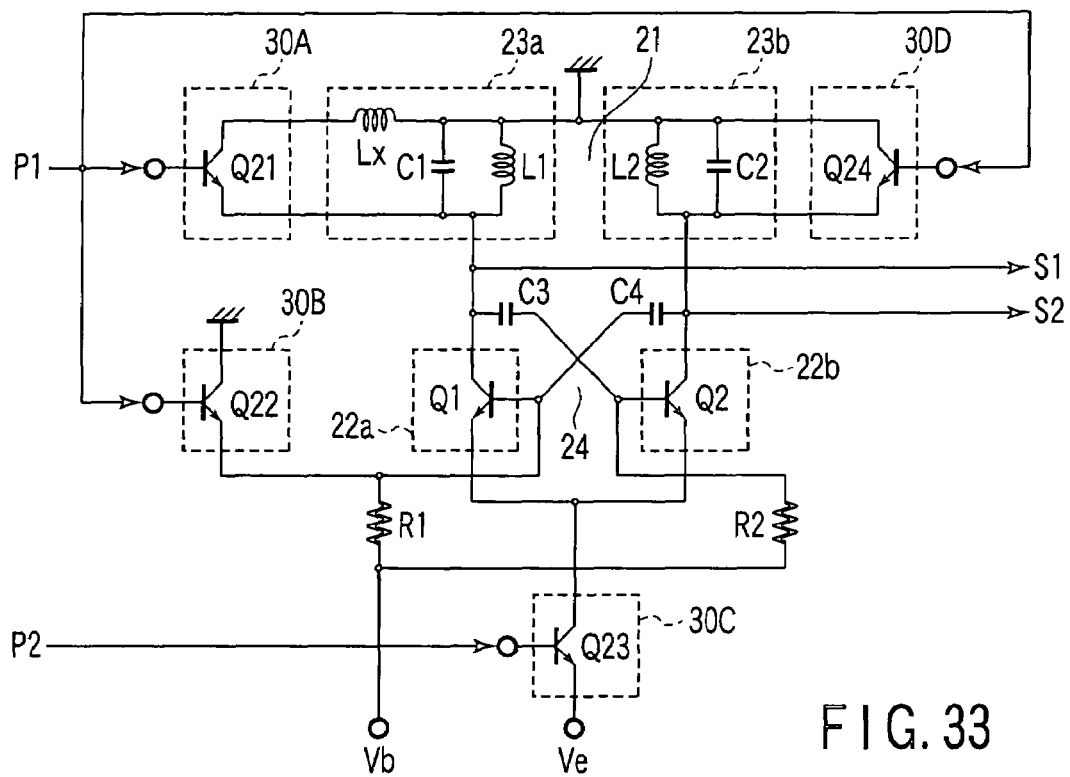
FIG. 33 is a block diagram depicting a schematic configuration of a modified example of the radar oscillator according to the fifth embodiment shown in FIG. 9.

FIG. 33 is a block diagram depicting a schematic configuration of a modified example of the radar oscillator 20 according to the fifth embodiment of the present invention shown in FIG. 9.

The radar oscillator 20 shown in FIG. 33 is basically configured in the same way as in the radar oscillator 20 shown in FIGS. 6 and 9 except that, as shown in FIG. 6, in the case where a plurality of amplifiers 22a and 22b and a plurality of amplifiers 23a and 23b are provided, an element Lx for setting a resonance frequency of the resonator 23a connected to the output side of the amplifier 22a outside of an oscillation enable range is connected to or disconnected from the resonator 23a by a first switch 30A composed of a transistor Q21; the input section of the amplifier 22a is connected to the earth line by a second switch 30B composed of a transistor Q22; the supply of the negative power Ve to the amplifiers 22a and 22b is stopped by a third switch 30C composed of a transistor Q23; and both ends of the resonator 23b connected to the output side of the amplifier 22b are connected to the earth line by a fourth switch 30D composed of a transistor Q24.

In the radar oscillator 20 shown in FIG. 33, the first switch 30A, the second switch 30B, and the third switch 30C alternately change an operating state of the oscillating unit 21 between the oscillating state and the oscillation stop state in order to intermit an output of the oscillation signal by a first pulse signal P1 indicating a transmission timing of a radar wave.

In addition, the fourth switch 30D alternately changes the operating state of the oscillating unit 21 between the oscillating state and the oscillation stop state in order to intermit an output of the oscillation signal by a second pulse signal P2 indicating a transmission timing of a radar wave.

Figure 34:
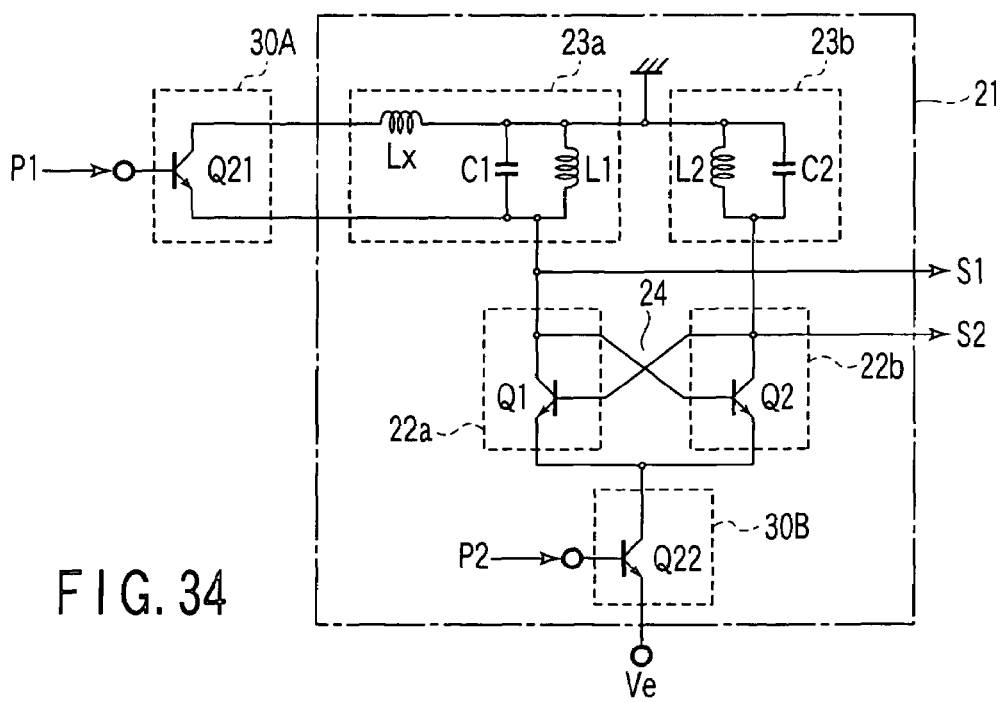
FIG. 34 is a block diagram depicting a schematic configuration of a modified example of the radar oscillator according to the fifth embodiment shown in FIG. 9.

FIG. 34 is a block diagram depicting a schematic configuration of a modified example of the radar oscillator 20 according to the fifth embodiment of the present invention shown in FIG. 9.

The radar oscillator 20 shown in FIG. 34 is basically configured in the same way as in the radar oscillator 20 shown in FIGS. 6 and 9 except that, as shown in FIG. 6, in the case where a plurality of amplifiers 22a and 22b and a plurality of resonators 23a and 23b are provided, an element Lx for setting a resonance frequency of the resonator 23a connected to the output side of the amplifier 22a outside of an oscillation enable range is connected to or disconnected from to the resonator 23a by the first switch 30A composed of the transistor Q21; and the supply of the negative power Ve to the amplifiers 22a and 22b is stopped by the second switch 30B composed of the transistor Q22.

As described above, it becomes possible to intermittently output an oscillation signal in response to a pulse signal indicating a transmission timing of a radar wave without producing a leak also by the radar oscillator 20 according to the fifth embodiment of the present invention.

In the radar oscillator 20 according to the fifth embodiment of the present invention, in particular, the switches 30 according to the above-described embodiments are selectively combined with each other; and the oscillating unit 21 is carried out to be alternately switched between the oscillating state and the oscillation stop state by a plurality of switches 30, thus making it possible to reliably prevent an occurrence of a leak as compared with a case where the oscillator 21 is changed by a single switch 30.

Sixth Embodiment

Figure 35:
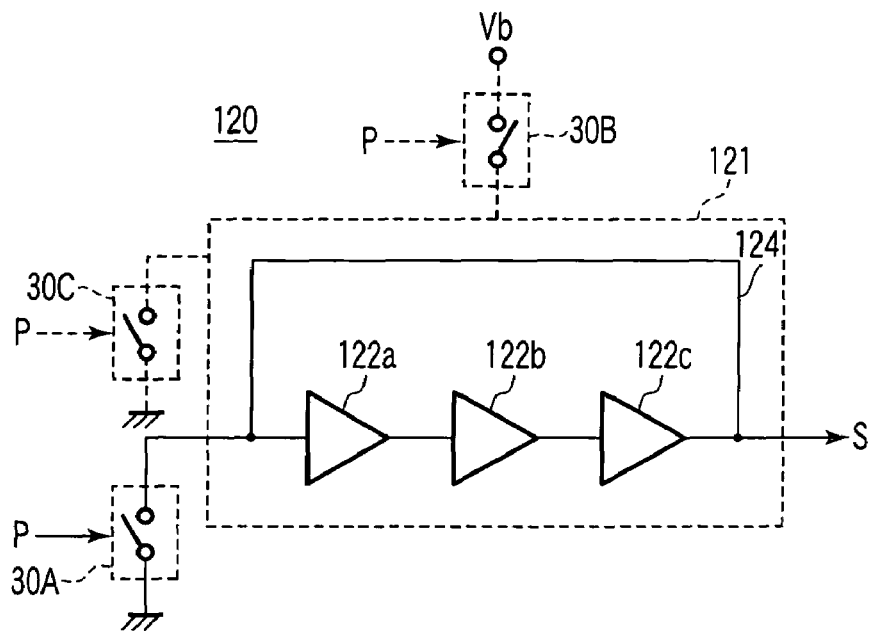
FIG. 35 is a block diagram depicting a schematic configuration of a radar oscillator according to a sixth embodiment of the present invention.

FIG. 35 is a block diagram depicting a schematic configuration of a radar oscillator according to a sixth embodiment of the present invention.

In the radar oscillator 120 shown in FIG. 35, the oscillating unit is configured as a ring oscillator circuit 121 in which a plurality of amplifiers 122a, 122b, and 122c are cascade-connected to one another as amplifiers (means), the ring oscillator circuit having a feedback circuit 124 for applying a feedback from the output section of the amplifier 122c at a final stage to the input section of the amplifier 122a at a first stage of the plurality of amplifiers 122a, 122b, and 122c. The oscillating unit is configured to output an oscillation signal S having the predetermined frequency which is determined by the ring oscillator circuit 121 from the output section of the amplifier 122c at the final stage.

Such the ring oscillating unit 121 serving as the oscillating unit shown in FIG. 35 can be regarded as being configured to have the plurality of amplifiers 122a, 122b, and 122c cascade-connected to one another as the amplifiers (means); and only the feedback circuit 124 which applies a feedback from the output section of the amplifier 122c at the final stage to the input section of the amplifier 122a at the first stage in order to contribute to oscillation at a predetermined frequency together with the plurality of amplifiers 122a, 122b, and 122c cascade-connected to one another as amplifiers (means).

Then, the radar oscillator 120 opens and closes the input section of the amplifier 122a at the first stage in response to first and second levels of a pulse signal P by a switch 30A, thereby alternately changing the operating state of the ring oscillator circuit 121 between the oscillating state and the oscillation stop state at the first and second levels of the pulse signal P.

In the radar oscillator 20 shown in FIG. 35, instead of the above-described switch 30A or as a plurality of switches which can be selectively combined with each other as indicated by the dashed line, there may be provided alone or in predetermined combination with the above-described switch 30A, a switch 30B for opening or closing a power supply (Vb) to the plurality of amplifiers 122a, 122b, and 122c cascade-connected to one another as (means) and a switch 30C for connecting or disconnecting an element for setting the ring oscillator circuit 122 outside of an oscillation enable range to or from the ring oscillator circuit 122.

Figure 36:
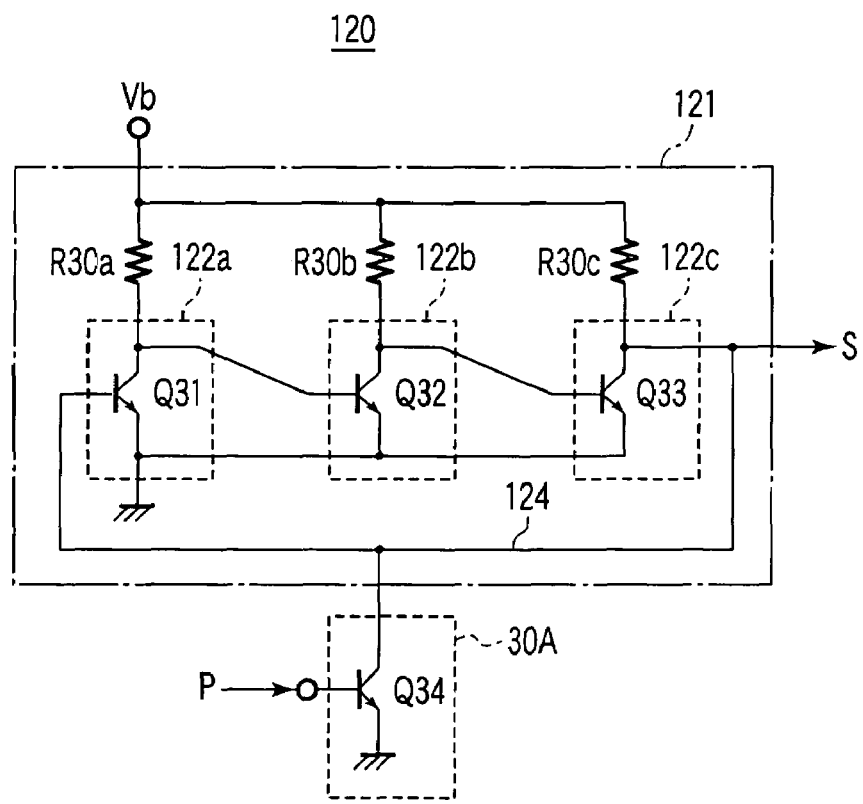
FIG. 36 is a diagram showing a specific circuit configuration of the radar oscillator according to the sixth embodiment shown in FIG. 35.

FIG. 36 is a view showing a specific circuit configuration of the radar oscillator according to the sixth embodiment of the present invention shown in FIG. 35.

In the radar oscillator 120 shown in FIG. 36, the plurality of amplifiers 122a, 122b, and 122c and the switch 30A are composed of transistors Q31, Q32, Q33, and Q34, respectively.

Here, in the transistors Q31 Q32, and Q33 serving as the plurality of amplifiers 122a, 122b, and 122c, their respective collectors are connected to the power supply Vb via resistors 30a, 30b, and 30c and their respective emitters are connected to the earth line.

The collector of the transistor Q31 is connected to a base of the transistor Q32 and the collector of the transistor Q32 is connected to a base of the transistor Q33.

In addition, the collector of the transistor Q33 serving as the feedback circuit 124 is connected to a base of the transistor Q31, whereby the ring oscillator circuit 121 is configured.

Then, an oscillation signal S having the predetermined frequency determined by the ring oscillator circuit 121 is output from the collector of the transistor Q33.

The feedback circuit 24 of such a ring oscillator circuit 121 is opened or closed with respect to a high frequency earth line by the switch 30A in response to the first and second levels of the pulse signal P, whereby the operating state of the ring oscillator circuit 121 is alternately switched between the oscillating state and the oscillation stop state at the first and second levels of the pulse signal P.

FIG. 37 is a block diagram depicting a schematic configuration of a modified example of the radar oscillator according to the sixth embodiment of the present invention shown in FIG. 35.

The radar oscillator 120 shown in FIG. 37 is basically configured in the same way as in the radar oscillator 120 shown in FIG. 35 except that a switch 30A for opening and closing a high frequency earth line for a plurality of amplifiers 122a, 122b, and 122c in common is used instead of the switch 30A in the radar oscillator shown in FIG. 35.

FIG. 38 is a view showing a specific circuit configuration of a modified example of the radar oscillator according to the sixth embodiment of the present invention shown in FIG. 37.

In the radar oscillator 120 shown in FIG. 38, a plurality of amplifiers 122a, 122b, and 122c are composed of a pair of transistors Q41 and Q42, a pair of transistors Q43 and Q44, and a pair o transistors Q45 and Q56, respectively.

The switch 30A is composed of transistors Q47, S48, and Q49 connected such that the respective collectors and emitters are associated with each other between the earth line and each common emitter of the paired transistors Q41 and Q42, the paired transistors Q43 and Q44, and the paired transistors Q45 and Q46.

Here, in the paired transistors Q41 and Q42, the paired transistors Q43 and Q44, and the paired transistors Q45 and Q46 serving as the plurality of amplifiers 122a, 122b, and 122c, their respective collectors are connected to the power supply Vb via resistors R41, R42, R43, R44, R45, and R46, and their respective emitters are connected to each other as each common emitter.

Each of the collectors of the transistors Q41 and Q42 is connected to be associated with each of the bases of the transistors Q43 and Q44, and each of the collectors of the transistors Q43 and Q44 is connected to each of the bases of the transistors Q45 and Q46.

In addition, each of the collectors of the transistors Q45 and Q46 serving as the feedback circuit 124 is connected to each of the bases of the transistors Q41 and Q42, whereby the ring oscillator circuit 121 is configured.

Then, oscillation signals S1 and S2 having the predetermined frequency determined by the ring oscillator circuit 121 are output from the collectors of the transistors Q45 and Q46.

Each of the bases of the transistors Q47, Q48, and Q49 serving as the switch 30A is connected to the input end of the pulse signal P in common.

The feedback circuit 124 of such a ring oscillator circuit 121 is opened and closed with respect to a high frequency earth line by the transistors Q47, Q48, and Q49 serving as the switch 30A in response to the first and second levels of the pulse signal P, whereby the operating state of the ring oscillator circuit 121 is alternately switched between the oscillating state and the oscillation stop state at the first and second levels of the pulse signal P.

As described above, it becomes possible to intermittently output an oscillation signal in response to a pulse signal indicating a transmission timing of a radar wave without producing a leak also by the radar oscillator 120 according to the sixth embodiment of the present invention.

The present invention is not limited to the above-described embodiments. For example, although a configuration using two transistors is provided in the specific circuit configuration of the oscillating unit 21 according to the above embodiments, the configuration does not limit the present invention. The present invention can be applied to the configuration using one or three or more transistors similarly.

Therefore, as described above in detail, according to the present invention, a switch for alternately changing an operating state of an oscillating unit between an oscillating state and an oscillation stop state is used in order to intermit an output of an oscillation signal in response to a level of a pulse signal, thereby making it possible to provide a radar oscillator which solves the problem of the prior art and which enables an intermittent output of the oscillation signal without producing a leak in response to the pulse signal.

The invention claimed is:

1. A radar oscillator comprising:
   an oscillating unit having amplifier means and at least one of a feedback circuit which applies a positive feedback from an output side to an input side of the amplifier means and a resonator which resonates at the predetermined frequency, the at least one of the feedback circuit and the resonator cooperating with the amplifier means to enable oscillation at a predetermined frequency, the resonator being connected to an input section or output section of the amplifier means, and the oscillating unit outputting and stopping an oscillation signal having the predetermined frequency from the output side of the amplifier means in an oscillating state and an oscillation stop state, respectively; and
   switching means connected to the oscillating unit, the switching means including an electronic switch which, receives a pulse signal indicating a transmission timing of a radar wave and changes an operating state of the oscillating unit to the oscillating state and the oscillation stop state at first and second levels of the pulse signal in order to intermit an output of the oscillation signal in response to a level of the pulse signal;
   wherein the oscillating unit selectively has a high frequency earth line, a power supply line for the amplifier means in the oscillating unit, and an element to set the oscillating unit outside of a normal operation range, and
   wherein the switching means includes a plurality of switches obtained by selectively combining:
      a first switch which opens or closes between at least one of the input section and the output section of the amplifier means in the oscillating unit and the high frequency earth line based on the pulse signal indicating the transmission timing of the radar wave, thereby changing the operating state of the oscillating unit to the oscillating state or the oscillation stop state;
      a second switch which connects or disconnects the element to set the oscillating unit outside of the normal operation range to and from the oscillating unit based on the pulse signal indicating the transmission timing of the radar wave, thereby changing the operating state of the oscillating unit to the oscillating state or the oscillation stop state; and
      a third switch which opens or closes the power supply line for the amplifier means in the oscillating unit based on the pulse signal indicating the transmission timing of the radar wave, thereby changing the operating state of the oscillating unit to the oscillating state or the oscillation stop state.

2. A radar oscillator comprising:
   an oscillating unit having amplifier means, a feedback circuit which applies a positive feedback from an output side to an input side of the amplifier means and a resonator which resonates at the predetermined frequency, the feedback circuit and the resonator cooperating with the amplifier means to enable oscillation at a predetermined frequency, the resonator being connected to an input section or output section of the amplifier means, and the oscillating unit outputting and stopping an oscillation signal having the predetermined frequency from the output side of the amplifier means in an oscillating state and an oscillation stop state, respectively; and
   switching means connected to the oscillating unit, the switching means including an electronic switch which receives a pulse signal indicating a transmission timing of a radar wave and changes an operating state of the oscillating unit to the oscillating state at a first level of the pulse signal and the oscillation stop state at a second level of the pulse signal in order to intermit an output of the oscillation signal in response to a level of the pulse signal;
   wherein the amplifier means includes an amplifier provided in an output stage of the oscillating unit;

wherein the oscillating unit has a power supply line for the amplifier means in the oscillating unit;

wherein the switching means includes a first switch which opens or closes the power supply line for the amplifier means in the oscillating unit based on the pulse signal indicating the transmission timing of the radar wave, thereby changing the operating state of the oscillating unit to the oscillating state or the oscillation stop state;

wherein the oscillating unit has an element to set a resonance frequency of the oscillator in the oscillating unit to a frequency which prevents a positive feedback from the output side to the input side of the amplifier means, thereby setting the resonance frequency outside of a normal operation range in the oscillating unit, and wherein the switching means includes a third switch which connects or disconnects the element to set the resonance frequency of the resonator in the oscillating unit outside of the normal operation range to and from the oscillating unit based on the pulse signal indicating the transmission timing of the radar wave, thereby changing the operating state of the oscillating unit to the oscillating state or the oscillation stop state.

3. A radar oscillator comprising:

an oscillating unit having amplifier means, a feedback circuit which applies a positive feedback from an output side to an input side of the amplifier means and a resonator which resonates at the predetermined frequency, the feedback circuit and the resonator cooperating with the amplifier means to enable oscillation at a predetermined frequency, the resonator being connected to an input section or output section of the amplifier means, and the oscillating unit outputting and stopping an oscillation signal having the predetermined frequency from the output side of the amplifier means in an oscillating state and an oscillation stop state, respectively; and switching means connected to the oscillating unit, the switching means including an electronic switch which receives a pulse signal indicating a transmission timing of a radar wave and changes an operating state of the oscillating unit to the oscillating state at a first level of the pulse signal and the oscillation stop state at a second level of the pulse signal in order to intermit an output of the oscillation signal in response to a level of the pulse signal;

wherein the amplifier means includes an amplifier provided in an output stage of the oscillating unit;

wherein the oscillating unit has a power supply line for the amplifier means in the oscillating unit;

wherein the switching means includes a first switch which opens or closes the power supply line for the amplifier means in the oscillating unit based on the pulse signal indicating the transmission timing of the radar wave, thereby changing the operating state of the oscillating unit to the oscillating state or the oscillation stop state;

wherein the oscillating unit has a high frequency earth line, and the switching means includes a second switch which opens or closes between at least one of the input section and the output section of the amplifier means in the oscillating unit and the high frequency earth line of the oscillating unit based on the pulse signal indicating the transmission timing of the radar wave, thereby changing the operating state of the oscillating unit to the oscillating state or the oscillation stop state;

wherein the oscillating unit has an element to set a resonance frequency of the oscillator in the oscillating unit to a frequency which prevents a positive feedback from the output side to the input side of the amplifier means, thereby setting the resonance frequency outside of a normal operation range in the oscillating unit; and wherein the switching means includes a third switch which connects or disconnects the element to set the resonance frequency of the resonator in the oscillating unit outside of the normal operation range to and from the oscillating unit based on the pulse signal indicating the transmission timing of the radar wave, thereby changing the operating state of the oscillating unit to the oscillating state or the oscillation stop state.

4. A radar oscillator comprising:

an oscillating unit having amplifier means, a feedback circuit which applies a positive feedback from an output side to an input side of the amplifier means and a resonator which resonates at the predetermined frequency, the feedback circuit and the resonator cooperating with the amplifier means to enable oscillation at a predetermined frequency, the resonator being connected to an input section or output section of the amplifier means, and the oscillating unit outputting and stopping an oscillation signal having the predetermined frequency from the output side of the amplifier means in an oscillating state and an oscillation stop state, respectively; and switching means connected to the oscillating unit, the switching means including an electronic switch which, receives a pulse signal indicating a transmission timing of a radar wave, and changes an operating state of the oscillating unit to the oscillating state and the oscillation stop state at first and second levels of the pulse signal in order to intermit an output of the oscillation signal in response to a level of the pulse signal;

wherein the resonator is connected to the input section or output section of the amplifier means, and the oscillating unit outputs and stops the oscillation signal having the predetermined frequency determined by the resonator from the output side of the amplifier means in the oscillating state and the oscillation stop state, respectively;

wherein the oscillating unit selectively has a high frequency earth line, a power supply line for the amplifier means in the oscillating unit, and an element to set a resonance frequency of the resonator in the oscillating unit outside of a normal operation range in the oscillating unit, and wherein the switching means includes a plurality of switches obtained by selectively combining:

a first switch which opens or closes between at least one of the input section and the output section of the amplifier means in the oscillating unit and the high frequency earth line based on the pulse signal indicating the transmission timing of the radar wave, thereby changing the operating state of the oscillating unit to the oscillating state or the oscillation stop state;

a second switch which connects or disconnects the element to set the resonance frequency of the resonator in the oscillating unit outside of the normal operation range to and from the oscillating unit based on the pulse signal indicating the transmission timing of the radar wave, thereby changing the operating state of the oscillating unit to the oscillating state or the oscillation stop state; and a third switch which opens or closes the power supply line for the amplifier means in the oscillating unit based on the pulse signal indicating the transmission timing of the radar wave, thereby changing the operating state of the oscillating unit to the oscillating state or the oscillation stop state.

* * * * *